US007656323B2

(12) United States Patent
Bereza et al.

(10) Patent No.: US 7,656,323 B2
(45) Date of Patent: Feb. 2, 2010

(54) APPARATUS FOR ALL-DIGITAL SERIALIZER-DE-SERIALIZER AND ASSOCIATED METHODS

(75) Inventors: William W. Bereza, Nepan (CA); Tad Kwasniewski, Ottawa (CA); Rakesh H. Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/119,406

(22) Filed: May 12, 2008

(65) Prior Publication Data

US 2008/0298476 A1  Dec. 4, 2008

Related U.S. Application Data

(60) Provisional application No. 60/941,282, filed on May 31, 2007.

(51) Int. Cl.
*H03M 9/00* (2006.01)
(52) U.S. Cl. .................. 341/100; 375/373; 370/537
(58) Field of Classification Search ......... 341/100–101; 375/371, 345, 350, 221, 354, 257; 370/537, 370/907; 327/117, 119, 219, 210
See application file for complete search history.

(56) References Cited

U.S. PATENT DOCUMENTS

| 7,038,516 | B2 * | 5/2006 | Hairapetian | 327/210 |
|---|---|---|---|---|
| 7,092,639 | B2 * | 8/2006 | Schultz et al. | 398/163 |
| 7,215,169 | B2 * | 5/2007 | Hairapetian | 327/210 |
| 7,298,301 | B2 * | 11/2007 | Zhang | 341/101 |
| 7,343,504 | B2 * | 3/2008 | Fernald et al. | 713/322 |
| 7,472,318 | B2 * | 12/2008 | Fan et al. | 714/704 |
| 2002/0097682 | A1 * | 7/2002 | Enam et al. | 370/241 |
| 2004/0136411 | A1 * | 7/2004 | Hornbuckle et al. | 370/537 |
| 2008/0107422 | A1 * | 5/2008 | Cole | 398/135 |
| 2008/0130816 | A1 * | 6/2008 | Martin et al. | 375/373 |

* cited by examiner

*Primary Examiner*—Lam T Mai
(74) *Attorney, Agent, or Firm*—Law Offices of Maximilian R. Peterson

(57) ABSTRACT

An all-digital serializer-de-serializer includes an all-digital clock multiplier unit (CMU) circuit, an all-digital clock and data recovery (CDR) circuit, a multiplexer (MUX), and a demultiplexer (DeMUX). The all-digital clock and data recovery (CDR) circuit couples to the all-digital clock multiplier unit (CMU) circuit. The multiplexer (MUX), couples to all-digital clock multiplier unit (CMU) circuit, and serializes data. The demultiplexer (DeMUX), couples to the all-digital clock and data recovery (CDR) circuit, and de-serializes data.

26 Claims, 16 Drawing Sheets

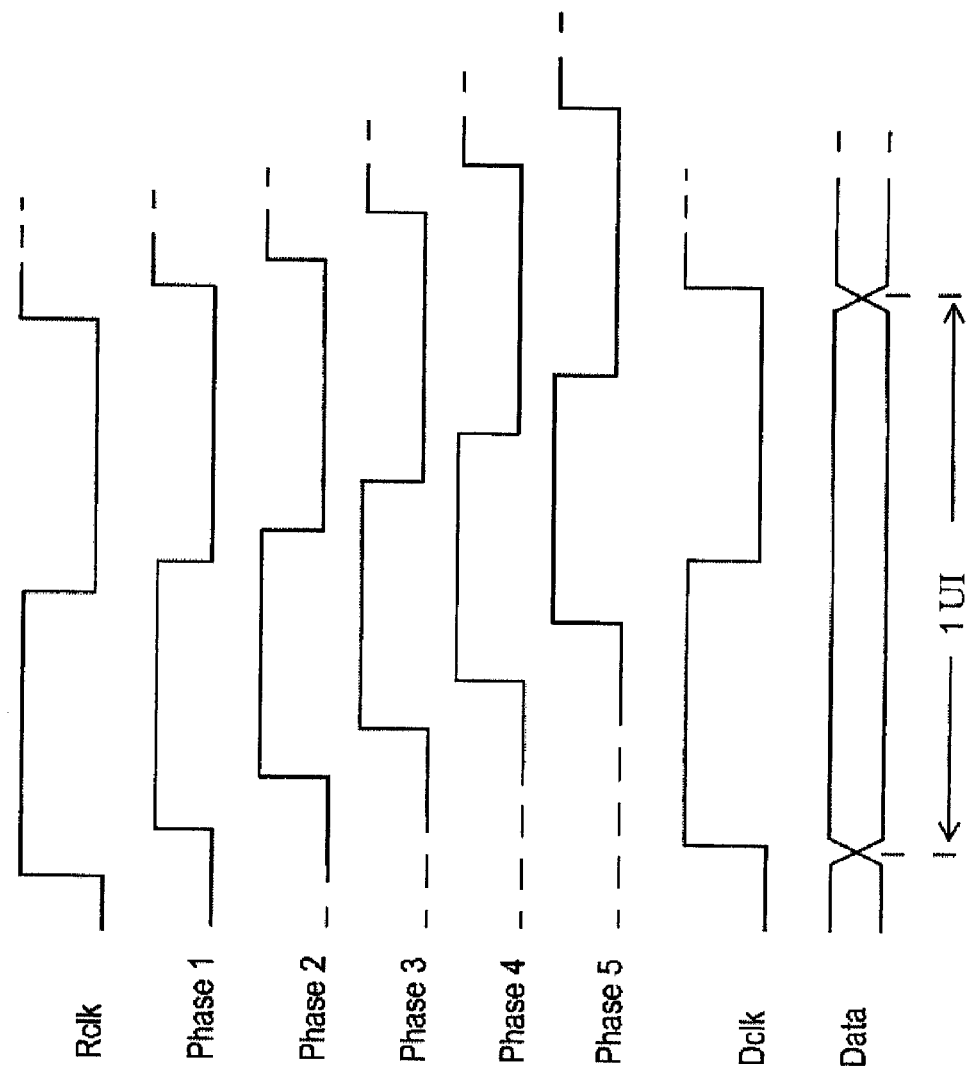

APPARATUS FOR ALL-DIGITAL SERIALIZER-DE-SERIALIZER AND ASSOCIATED METHODS

CROSS-REFERENCE TO RELATED APPLICATIONS

This patent application claims priority to, and incorporates by reference, U.S. Provisional Patent Application Ser. No. 60/941,282, filed on May 31, 2007, titled "Apparatus for Serializer-Deserializer and Delay-Locked Loop and Associated Methods." Furthermore, this patent application incorporates by reference, U.S. patent application Ser. No. 11/716,229, filed on Mar. 9, 2007, titled "Zero-Delay Serial Communications Circuitry for Serial Interconnects."

TECHNICAL FIELD

The disclosed concepts relate generally to communication circuitry in integrated circuits (ICs), and, more particularly, to all-digital serializer-de-serializer circuitry and all-digital phase generating delay-locked loops (DLLs) in ICs, such as programmable logic devices (PLDs).

BACKGROUND

Modern electronics has ushered in an era of high-speed communications. Usually, one or more ICs generate signals that they seek to communicate with various destinations, such as other ICs. To do so efficiently, various ICs today use serial communication links. To use the communication link, a source circuit or IC serializes the information that it wishes to communicate with a destination circuit or IC. The serialized information travels to the destination circuit or IC via the communication link. At the destination, the destination circuit or IC de-serializes the information and uses the results for additional tasks, such as further processing, and the like.

SUMMARY

The disclosed concepts relate to all-digital serializer-de-serializer (SerDes) circuitry, and associated methods. In one exemplary embodiment, an all-digital serializer-de-serializer includes an all-digital clock multiplier unit (CMU) circuit, an all-digital clock and data recovery (CDR) circuit, a multiplexer (MUX), and a demultiplexer (DeMUX). The all-digital CDR circuit couples to the all-digital CMU circuit. The MUX couples to the all-digital CMU and serializes data. The DeMUX couples to the all-digital CDR, and de-serializes data.

In another exemplary embodiment, a programmable logic device (PLD) includes a serializer-de-serializer circuit. The serializer-de-serializer circuit includes an all-digital CMU circuit and an all-digital CDR circuit, coupled to the all-digital CMU circuit. The all-digital CMU circuit and the all-digital CDR circuit include matched digitally controlled oscillators.

In yet another exemplary embodiment, a method processing signals in an integrated circuit (IC) includes digitally producing a multiplied clock signal from a reference clock signal, and digitally acquiring data and clock signals from a first set of data signals to generate acquired data signals and acquired clock signal.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIG. 16 shows a timing diagram for a multiple phase generating DLL according to an illustrative embodiment.

DETAILED DESCRIPTION

The disclosed concepts relate to all-digital serializer-de-serializer (SerDes) circuitry, and associated methods. The disclosed concept provide for all-digital SerDes that provide advantages such as lower cost, better performance, and better repeatability of performance over conventional SerDes.

Specifically, conventional SerDes use analog components (e.g., analog charge pumps, analog voltage-controlled oscillators (VCOs), analog phase locked loops (PLLs), and analog filters). The analog components and blocks have become increasingly incompatible with newer technologies based on complementary metal oxide semiconductor (CMOS) technologies. For example, analog components might use 1.8V or 3.3V supply voltages, whereas digital circuits in the SerDes might use 1V or 1.2V supply voltages. The all-digital SerDes eliminate most analog blocks previously found in conventional SerDes (e.g., analog charge pumps, analog VCOs, analog PLLs, and analog filters). For example, the all-digital SerDes replace analog VCOs with digitally controlled oscillators, DCOs, which use an analog core oscillator.

Figure 1:
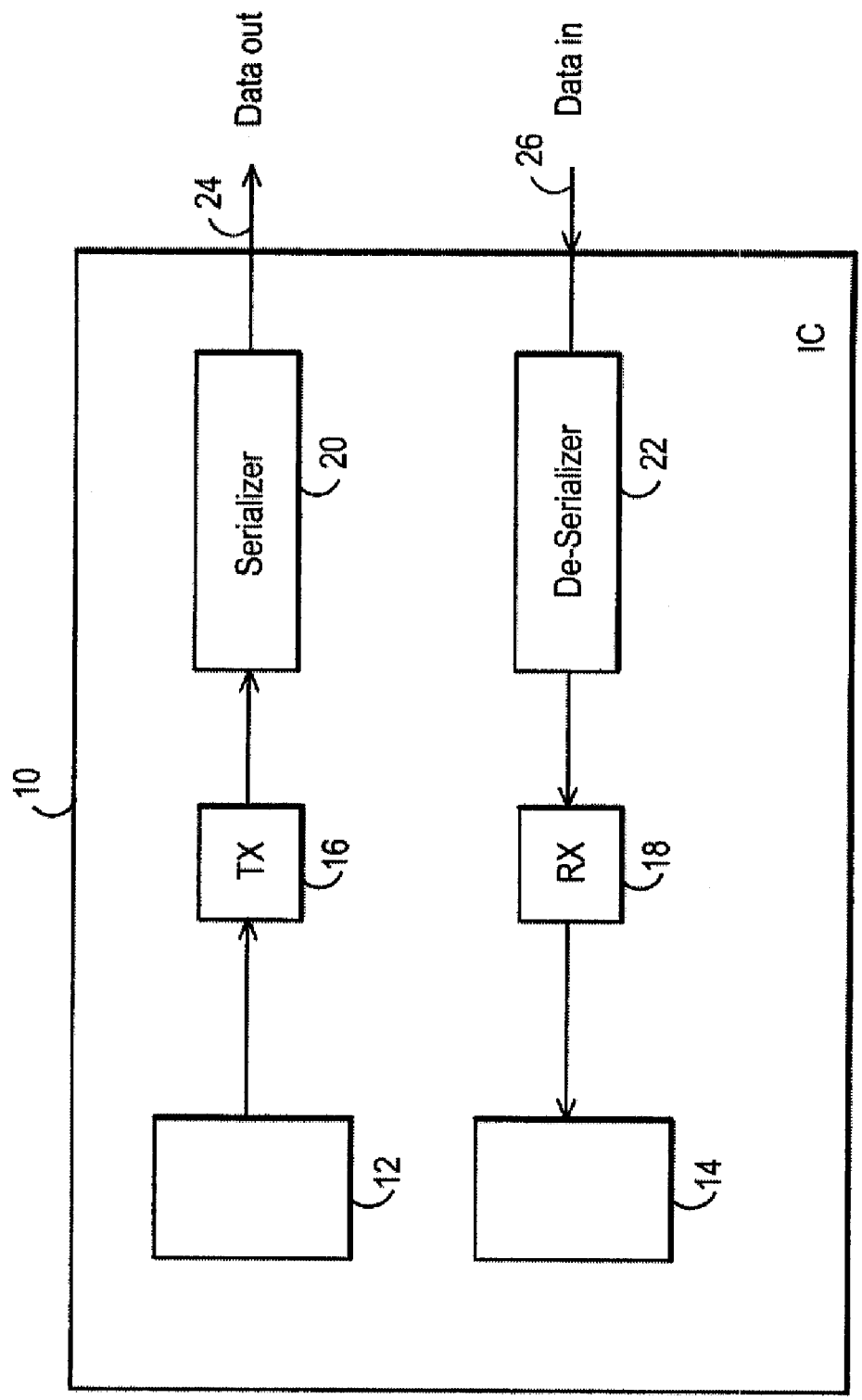
FIG. 1 illustrates a simplified block diagram of an IC according to an exemplary embodiment.

FIG. 1 illustrates a simplified block diagram of an IC 10 according to an exemplary embodiment. IC 10 includes an all-digital serializer 20, and an all-digital de-serializer 22. A source circuit 12 serves as the source of information that one wishes to communicate to a destination, such as another IC. Source circuit 12 provides the information to transmitter (TX) 16. Transmitter 16 may have a structure known to, and provide functionality understood by, persons of ordinary skill in the art.

Transmitter 16 processes the information in a manner understood by, and using structures and circuitry known by, persons of ordinary skill in the art who have the benefit of the description of the disclosed concepts, and provides the results to all-digital serializer 20. All-digital serializer 20 serializes the information, and provides the resulting serialized information 24 as the data out. Generally, all-digital serializer 20 may provide the data out to a suitable medium, such as a communication channel (not shown explicitly), as persons of ordinary skill in the art who have the benefit of the description of the disclosed concepts understand.

To receive information from a desired source (e.g., a communication medium or channel, not shown explicitly), IC 10 accepts serialized data in 26. All-digital de-serializer 22 receives the serialized data in 26, de-serializes the information, and provides the results to receiver (RX) 18. Receiver 18 processes the information further in a manner understood by, using circuitry and structures known to, persons of ordinary skill in the art who have the benefit of the description of the disclosed concepts, and provides the results to destination circuit 14. Destination circuit 14 may process the information further, or use the information in a desired manner, or both.

Figure 2:
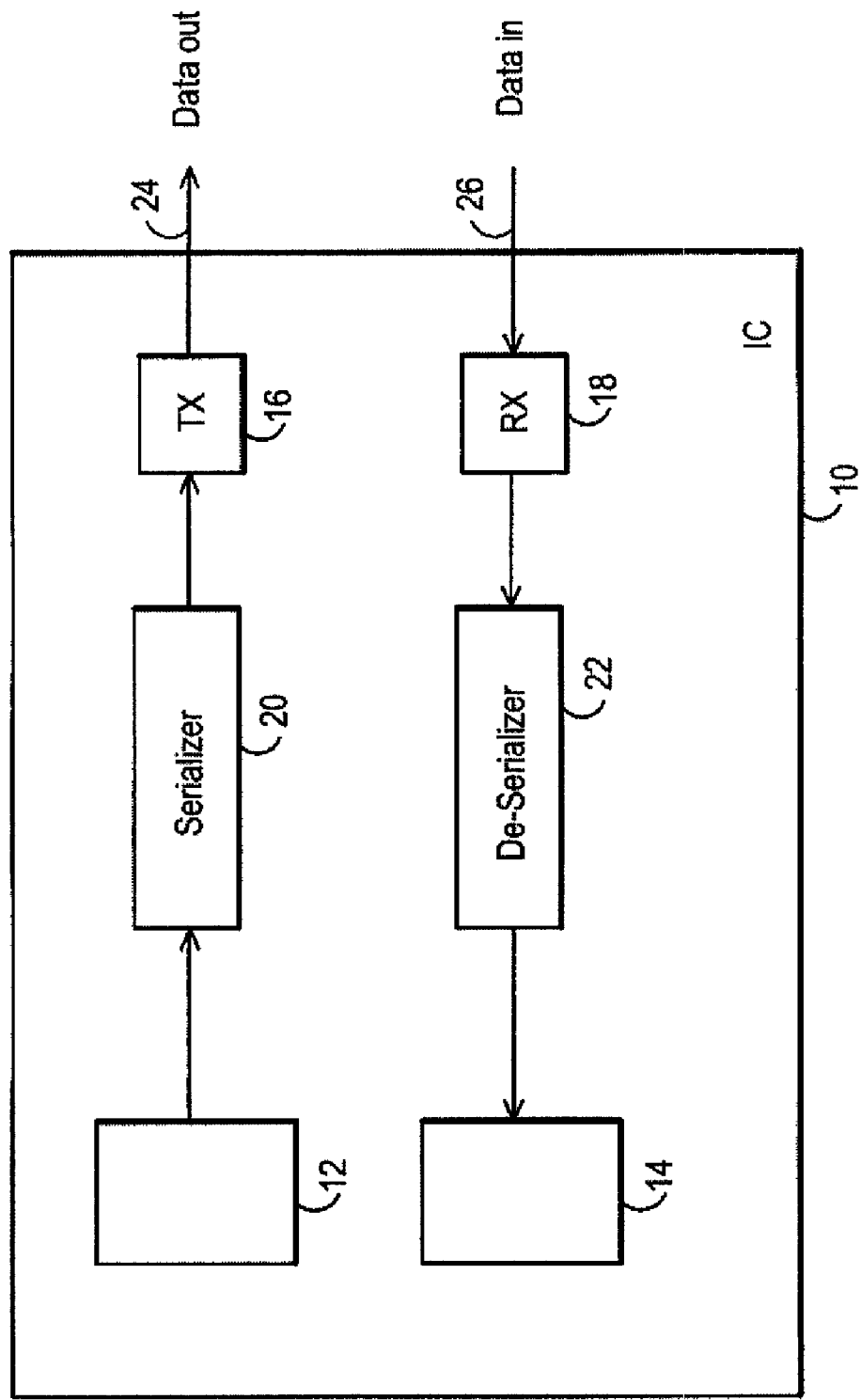
FIG. 2 depicts a simplified block diagram of an IC according to another exemplary embodiment.

Note that one may reverse the order of transmitter 16 and serializer 20, as desired, by making modifications that fall within the knowledge of persons of ordinary skill in the art who have the benefit of the description of the disclosed concepts. Similarly, one may reverse the order of receiver 18 and de-serializer 22, as desired, by making modifications that fall within the knowledge of persons of ordinary skill in the art who have the benefit of the description of the disclosed concepts. FIG. 2 shows a simplified block diagram of an IC 10 with the order of transmitter 16 and serializer 20 reversed, and with the order of receiver 18 and de-serializer 22 reversed.

Figure 3:
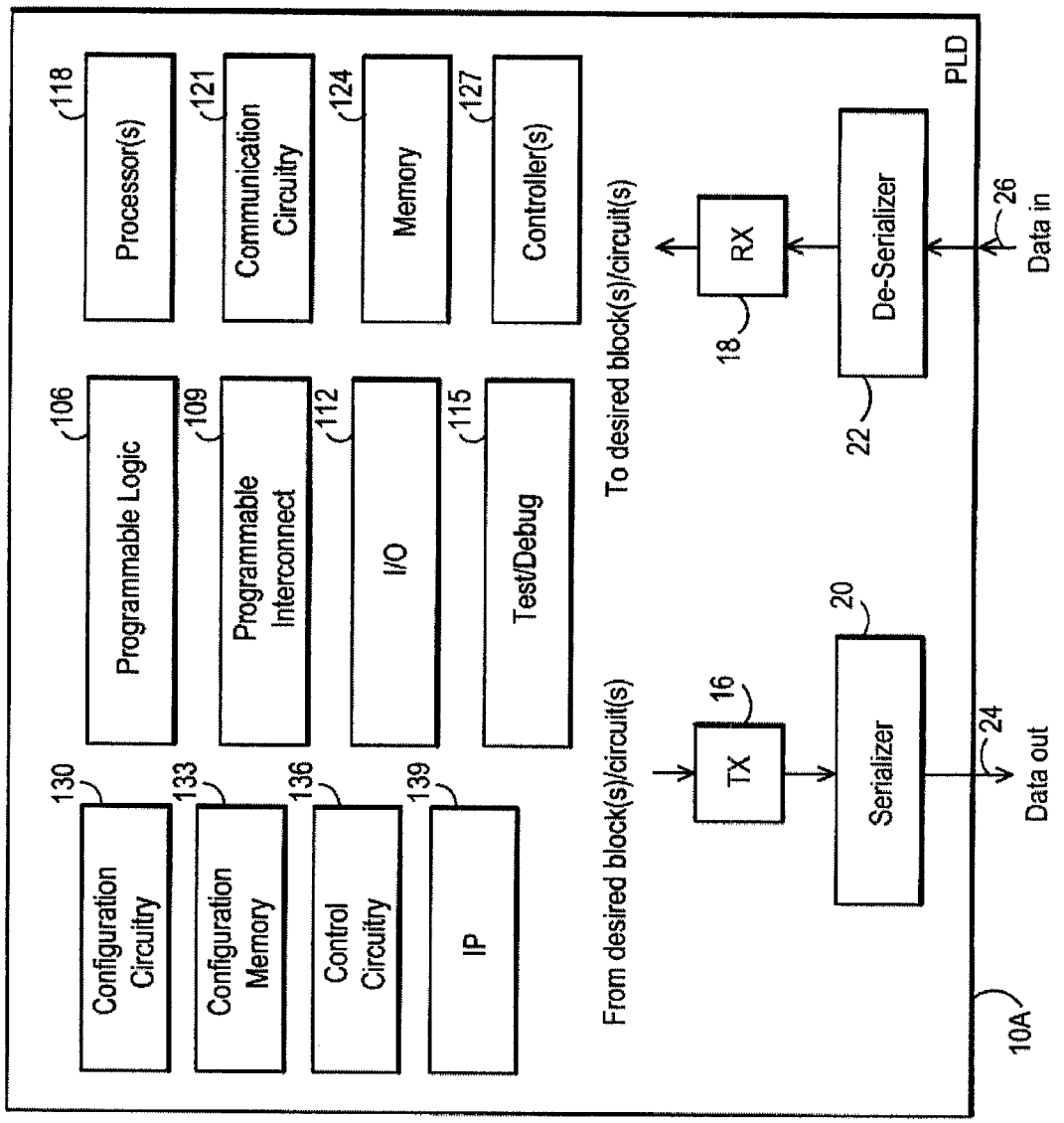
FIG. 3 shows a simplified block diagram of a PLD according to an exemplary embodiment.

In some exemplary embodiments, IC 10 may constitute or comprise a PLD. FIG. 3 shows a simplified block diagram of a PLD 10A according to an exemplary embodiment.

PLD 10A includes configuration circuitry 130, configuration memory (CRAM) 133, control circuitry 136, programmable logic 106, programmable interconnect 109, and I/O circuitry 112. In addition, PLD 10A may include test/debug circuitry 115, one or more processors 118, one or more communication circuitry 121, one or more memories 124, one or more controllers 127, intellectual property (IP) circuitry 139, as desired. Furthermore, PLD 10A includes transmitter 16, all-digital serializer 20, all-digital de-serializer 22, and receiver 18, all described above.

Note that FIG. 3 shows a simplified block diagram of PLD 10A. Thus, PLD 10A may include other blocks and circuitry, as persons of ordinary skill in the art understand. Examples of such circuitry include clock generation and distribution circuits, redundancy circuits, and the like. Furthermore, PLD 10A may include, analog circuitry, other digital circuitry, and/or mixed-signal circuitry, as desired. One may apply the disclosed methodology and concepts to other PLD architectures, including any desired blocks, regions, or circuits, as persons of ordinary skill in the art who have the benefit of this disclosure understand.

Transmitter 16, all-digital serializer 20, all-digital de-serializer 22, and receiver 18 perform the functions described above in connection with FIGS. 1 and 2. Transmitter 16 may receive information from a variety of circuitry within PLD 10A, such as programmable logic 106, processor(s) 118, IP circuitry 139, and the like. Similarly, receiver 18 may provide information to a variety of circuitry within PLD 10A, such as programmable logic 106, processor(s) 118, IP circuitry 139, etc.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 10A.

Control circuitry 136 controls various operations within PLD 10A, including aspects of the inventive concepts. Under the supervision of control circuitry 136, PLD configuration circuitry 130 uses configuration data (which it obtains from an external source, such as a storage device, a host, etc.) to program or configure the functionality of PLD 10A. Configuration data typically store information in CRAM 133. The contents of CRAM 133 determine the functionality of various blocks of PLD 10A, such as programmable logic 106 and programmable interconnect 109, as persons of ordinary skill in the art who have the benefit of this disclosure understand.

I/O circuitry 112 may constitute a wide variety of I/O devices or circuits, as persons of ordinary skill in the art who have the benefit of the description of the invention understand. I/O circuitry 112 may couple to various parts of PLD 10A, for example, programmable logic 106 and programmable interconnect 109. I/O circuitry 112 provides a mechanism and circuitry for various blocks within PLD 10A to communicate with external circuitry or devices.

Test/debug circuitry 115 facilitates the testing and troubleshooting of various blocks and circuits within PLD 10A. Test/debug circuitry 115 may include a variety of blocks or circuits known to persons of ordinary skill in the art who have the benefit of the description of the invention. For example, test/debug circuitry 115 may include circuits for performing tests after PLD 10A powers up or resets, as desired. Test/debug circuitry 115 may also include coding and parity circuits, as desired.

PLD 10A may include one or more processors 118. Processor 118 may couple to other blocks and circuits within PLD 10A. Processor 118 may receive data and information from circuits within or external to PLD 10A and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 10A may include one or more IP circuitry 139. IP circuitry 139, as persons of ordinary skill in the art who have the benefit of the description of the disclosed concepts understand, represents a block of circuitry added to PLD 10A, such as a processor, a special-purpose circuit or block, and the like.

PLD 10A may also include one or more communication circuits 121. Communication circuit(s) 121 may facilitate data and information exchange between various circuits within PLD 10A and circuits external to PLD 10A, as persons of ordinary skill in the art who have the benefit of this disclosure understand.

PLD 10A may further include one or more memories 124 and one or more controller(s) 127. Memory 124 allows the storage of various data and information (such as user-data, intermediate results, calculation results, etc.) within PLD 10A. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

Figure 4:
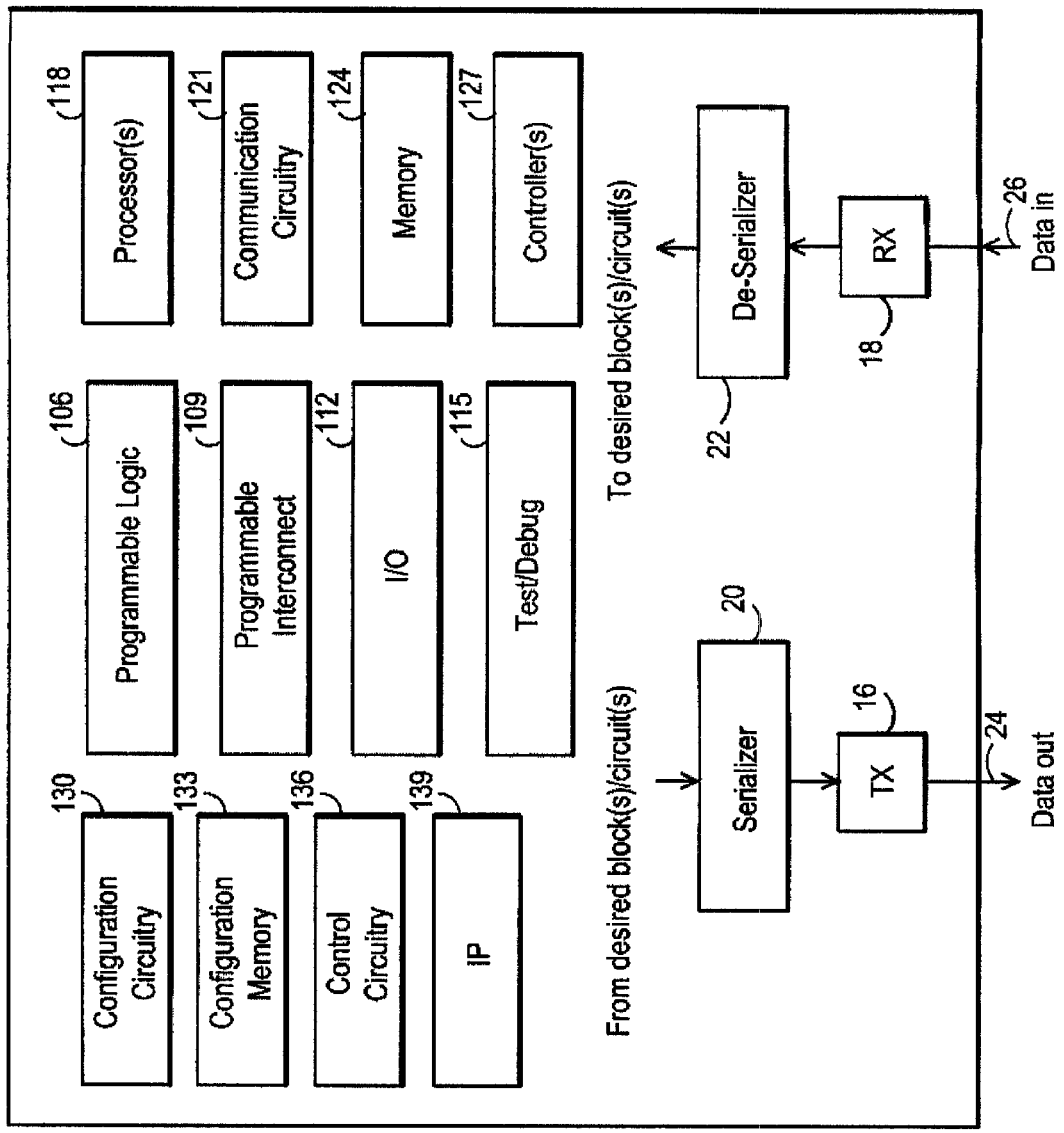
FIG. 4 illustrates a simplified block diagram of a PLD according to another exemplary embodiment.

Note that one may reverse the order of transmitter 16 and serializer 20, as desired, by making modifications that fall within the knowledge of persons of ordinary skill in the art who have the benefit of the description of the disclosed concepts. Similarly, one may reverse the order of receiver 18 and de-serializer 22, as desired, by making modifications that fall within the knowledge of persons of ordinary skill in the art who have the benefit of the description of the disclosed concepts. FIG. 4 shows a simplified block diagram of a PLD 10A with the order of transmitter 16 and serializer 20 reversed, and with the order of receiver 18 and de-serializer 22 reversed.

As persons of ordinary skill in the art who have the benefit of the description of the disclosed concepts understand, data in 26 and data out 24 may constitute any desired type of signal suitable for de-serialization and serialization, respectively. Examples include Low Voltage Differential Signal(ing) (LVDS), single-ended signals, general differential signals, voltage signals, current signals, and the like. The particular type of signal depends on the design and specifications of a given application.

Figure 5:
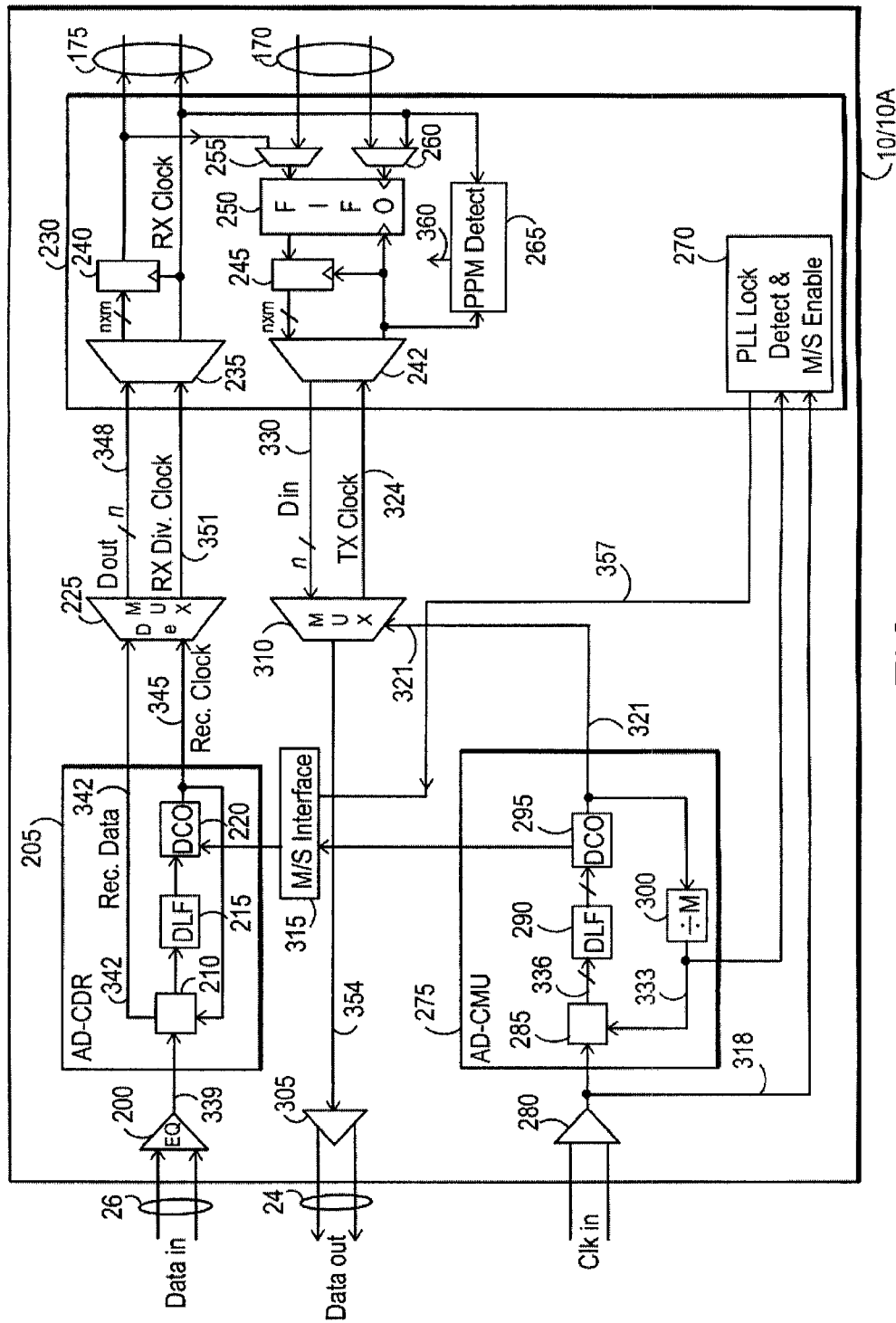
FIG. 5 depicts a simplified diagram of an all-digital SerDes according to an exemplary embodiment.

FIG. 5 shows a block diagram of an all-digital SerDes according to an exemplary embodiment. Broadly speaking, the all-digital SerDes includes three main blocks: all-digital clock and data recovery (AD-CDR) circuit 205, digital control and processing circuit 230, and all-digital clock multiplier unit (AD-CMU) 275 (also known as transmit phase locked loop (PLL)). As noted above, one may use the all-digital SerDes in a desired IC 10 (see FIGS. 1-2), for example, PLD 10A (see FIGS. 3-4) in illustrative embodiments.

As described below in detail, AD-CMU 275 synthesizes output signal 321 with a desired frequency, and with relatively low jitter. Signal 321 enables multiplexing the serialized data in multiplexer (MUX) 310. AD-CDR 205 receives a serial data stream, and recovers the data and their associated clock signal from the data in preparation for synchronous de-serialization. Digital control and processing circuit 230 provides additional data processing and control of the operation of the all-digital SerDes, as described below in detail.

Generally speaking, the novel all-digital SerDes disclosed here operate using a different principle than conventional analog SerDes. Specifically, the disclosed all-digital SerDes allows the AD-CDR 205 to acquire frequency lock through interaction with the AD-CMU 275 by using master/slave (M/S) interface 315 (described below in detail).

AD-CMU 275 accepts a lower frequency reference clock signal (labeled as CLK in), as buffered or conditioned by buffer 280 to generate buffered clock signal 318, and synthesizes the higher frequency signal 321 used to serialize data using MUX 310. MUX 310 also generates divided-down clock signal (labeled as "TX Clock") at node 324 from signal 321, and provides it as a clock signal to digital control and processing circuit 230 (specifically to MUX 242) to facilitate the operation of some its blocks and circuits.

AD-CMU 275 includes the following all-digital blocks of circuitry: digital non-linear phase detector (NLPD) 285, digital loop filter 290, digitally controlled oscillator (DCO) 295, and digital divider (divide-by-M) 300, all coupled in a loop configuration. In other words, divider 300 divides the frequency of signal 321 (output signal of DCO 295), and provides divided signal 333 to NLPD 285.

Figure 6:
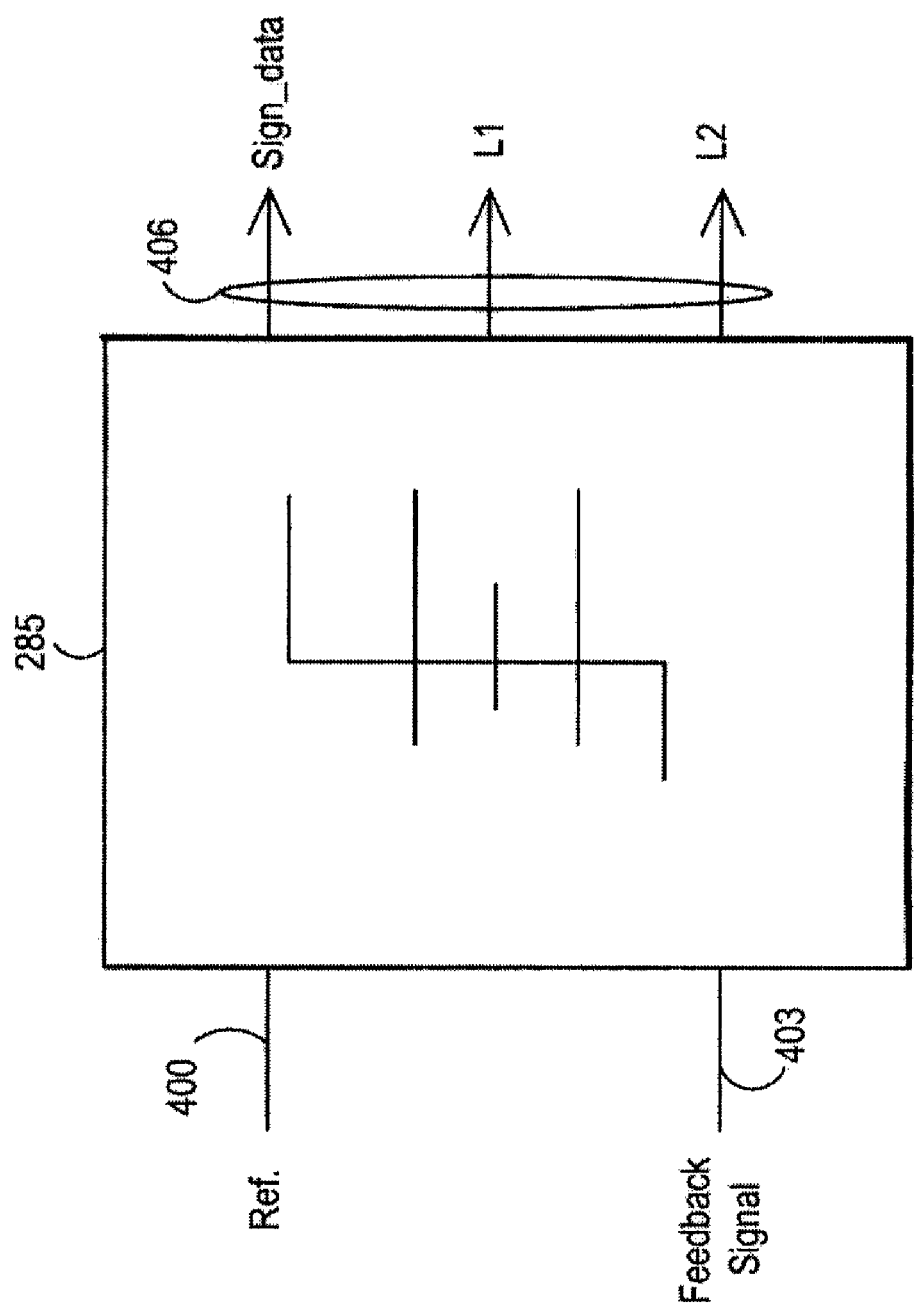
FIG. 6 depicts a simplified block diagram of a non-linear and/or multi-level phase detector for use in exemplary embodiments.

FIG. 6 shows a simplified block diagram of NLPD 285. Generally, NLPD 285 compares the phase of an input reference signal 400 with the phase of a feedback signal 403 and generates output signals 406. Output signals 406 include signal sign-data, signal L1, and signal L2.

Figure 7:
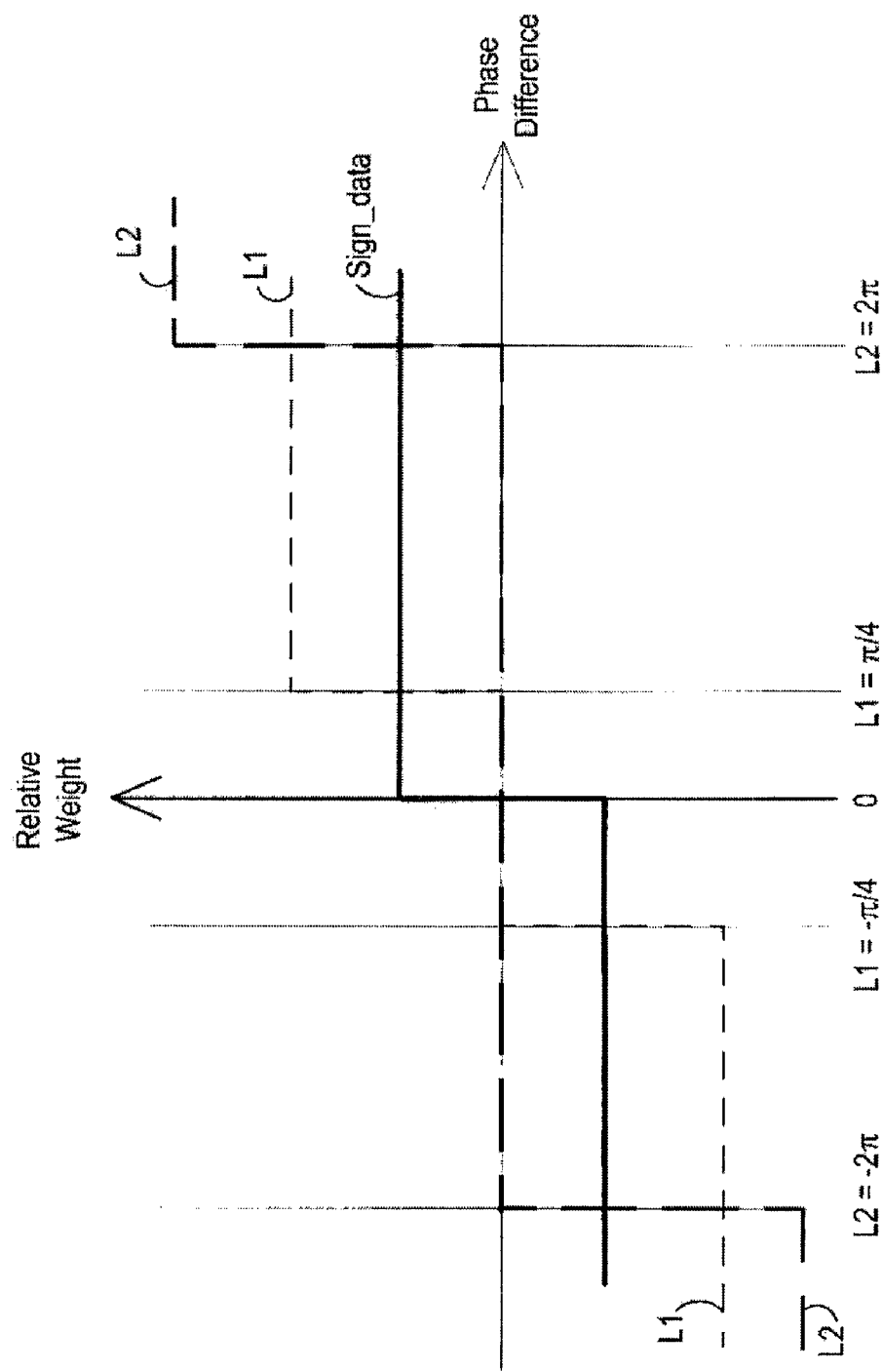
FIG. 7 shows a transfer function of the non-linear multi-level phase detector in an illustrative embodiment.

NLPD 285 quantizes the phase difference between reference signal 400 and feedback signal 403. FIG. 7 shows a transfer function of the non-linear phase detector in an illustrative embodiment. Note that in the embodiment shown, NLPD 285 quantizes the phase difference as three possible levels.

NLPD 285 senses whether the phase of reference signal 400 is greater than or less than the phase of feedback signal 403 about the zero-phase-difference reference point, as seen in FIG. 7. Depending on the amount of phase difference detected, NLPD 285 will produce outputs whose relative weight gets larger with more phase error in a relatively non-linear manner (hence the label "non-linear phase detector").

NLPD 285 activates its outputs depending on the threshold reached by the phase difference between reference signal 400 and feedback signal 403. In the embodiment shown, if the magnitude of the phase difference falls between 0 and $\pi/4$ radians (phase of reference signal 400 is greater than the phase of feedback signal 403), the phase detector quantizes the difference to produce a digital 1 (i.e., binary logic one) pulse at the sign_data output. If the phase difference has an amount between 0 and $-\pi/4$ radians (phase of reference signal 400 is less than the phase of feedback signal 403), then NLPD 285 produces a digital 0 pulse (i.e., binary logic zero) at the sign_data output.

If the phase difference falls between $\pi/4$ and $2\pi$ radians (or between $-\pi/4$ and $-2\pi$ radians), then in addition to activating sign_data described above, NLPD 285 similarly generates another output, labeled L1. Finally, if the phase difference is greater than $2\pi$ radians (or less than $-2\pi$ radians), NLPD 285 generates a third output, labeled L2. Thus, by observing outputs 406 (i.e., sign_data, L1, and L2) of NLPD 285, one can discern the phase difference between the signals at input 400 and input 403 (i.e., between the reference signal and the feedback signal).

Note that the transfer function in FIG. 7 constitutes merely one example. One may use NLPDs with other transfer functions, as desired (e.g., different quantization levels, relative weights, L1 and L2 values, etc.). The choice of the transfer function depends on a variety of factors, such as the desired design and specifications for a particular application, etc., as persons of ordinary skill in the art who have the benefit of the description of the disclosed concepts understand.

Similarly, the L1 and L2 thresholds shown in FIG. 7 and described above constitute merely typical values in one illustrative embodiment. One may use other threshold values, as desired, and as persons of ordinary skill in the art who have the benefit of the description of the disclosed concepts understand. For example, in one embodiment, one may implement NLPD 285 so as to make the L1 and L2 values programmable between $\pi/10$ radians and $\pi/2$ radians. The choice of the L1 and L2 values depends on a variety of factors, such as the desired design and specifications for a particular application, etc., as persons of ordinary skill in the art who have the benefit of the description of the disclosed concepts understand.

In the embodiment shown in FIG. 5, NLPD 285 receives as its input signals clock signal 318 and output signal 333 of divider 300. NLPD 285 then produces output signals 336 (as described above in detail), and supplies them to digital loop filter 290.

Referring to AD-CMU 275 in FIG. 5, digital loop filter 290 receives the output pulses of NLPD 285. Note that by nature of the quantization NLPD 285 undertakes, to maintain stability, one should use both proportional and integral signal processing paths. Accordingly, digital loop filter 290 uses both proportional and integral signal processing paths.

Figure 8:
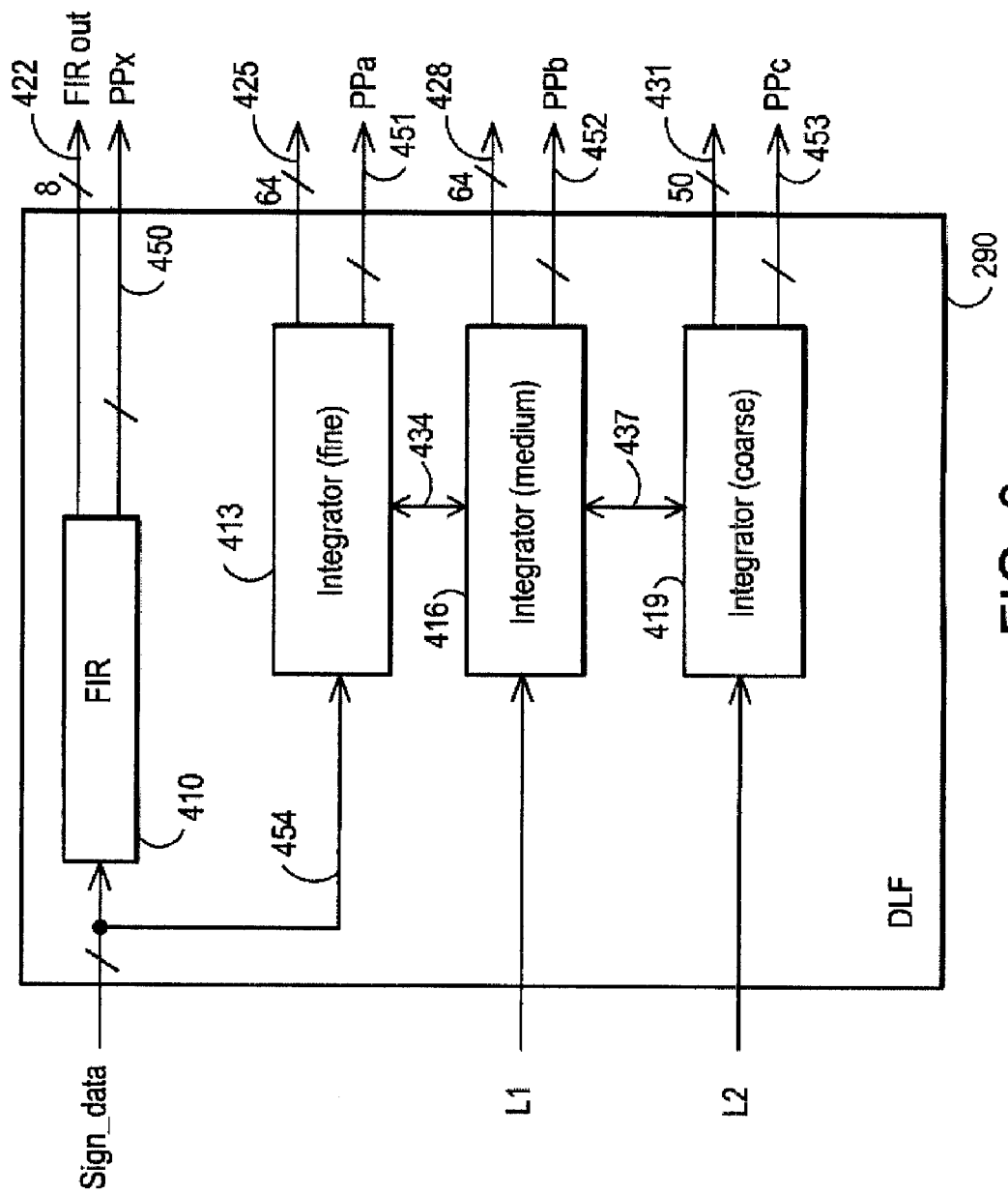
FIG. 8 illustrates a simplified block diagram of the digital loop filter according to an illustrative embodiment.

FIG. 8 shows a simplified block diagram of digital loop filter 290 according to an illustrative embodiment. Digital loop filter 290 includes finite impulse response (FIR) filter 410, and three shift-register-based integrators, integrator 413 (to produce fine words 425), integrator 416 (to produce medium words 428), and integrator 419 (to produce coarse words 431). FIR filter 410 and integrator 413 receives the sign_data (labeled as 454) output of NLPD 285, whereas integrator 416 and integrator 419 receive its L1 and L2 outputs, respectively. Note that, rather than using shift registers to implement the integrators, one may use other techniques, as desired, and as persons of ordinary skill in the art who have the benefit of the description of the disclosed concepts understand.

Sign-data pulses, fed into FIR filter 410 and integrator 413, produce both proportional and integral path adjustments. The adjustments depend on the specific implementations of FIR filter 410 and integrator 413, which depend on the design and specifications for a particular application, as persons of ordinary skill in the art who have the benefit of the description of the disclosed concepts understand.

Note that proportional path adjustments are directly related to sign-data activity. Proportional path (i.e., sign-data) activity traverses FIR filter 410 (implemented in one embodiment with an FIR filter circuit and shift registers used to implement up/down counters that offer intrinsic sin x/x filtering). The proportional path, in conjunction with the integral path, provides overall stability from one clock cycle to the next.

The fine, medium, and coarse words (labeled as 425, 428, and 431, respectively), together with output 422 (FIR out) of FIR filter 410, control the output frequency of DCO 290. The fine, medium, and coarse words cause changes in frequency of DCO 295 as a result of changes in each bit in the corresponding word.

Because AD-CMU 275 relies on integrating phase information to move and maintain lock, DCO 295 receives commands that cause discrete frequency jumps to move and maintain lock. In the embodiment shown, DCO 295 receives four commands or control words that cause changes in its output frequency. Specifically, output word 422 of FIR filter 410, fine word 425 generated by integrator 413, medium word 428 generated by integrator 416, and coarse word 431 generated by integrator 419 cause changes in the output frequency of DCO 295.

Note, however, that changes in output word 422 of FIR filter 410 and control words 425, 428, and 431, respectively, of integrators 413, 416, and 419, cause varying amounts of frequency change in the output signal of DCO 295. For example, a change in one bit of output word 422 of FIR filter may cause a smaller change in the frequency of the output of DCO 295 than does a one-bit change in fine word 425, etc.

In one embodiment, FIR filter 410 averages out the first stream of 8 phase comparisons in a running total. Integrator 413 (corresponding to fine word 425) acts as an accumulator, with similar weights as FIR filter 410. Integrator 416 (corresponding to medium word 428) and integrator 419 (corresponding to coarse word 431) also act as accumulators, but each bit for those integrators represents a larger change in the frequency of the output signal of DCO 295.

One may use a desired number of bits in each of the four control words. The bit changes in the four control words may correspond to desired changes in frequency. The number of bits and the frequency changes corresponding to each bit change depend on factors such as the design and specifications for a particular application, etc., as persons of ordinary skill in the art who have the benefit of the description of the disclosed concepts understand.

In one exemplary embodiment, for example, output word 422, fine word 425, medium word 428, and coarse word 431 include, respectively, 8 bits, 64 bits, 64 bits, and 50 bits. In this embodiment, each bit of output word 422 of FIR filter 410 and each bit of fine word 425 represent a 50-KHz frequency change (i.e., a total of 64 bits of 50 KHz each for fine word 425), whereas each bit of medium word 428 and coarse word 431 represent, respectively, 1.6 MHz (i.e., a total of 64 bits of 1.6 MHz each for medium word 428) and 51.2 MHz (i.e., a total of 50 bits of 51.2 MHz each for coarse word 431).

As each integrator counts to a maximum value, the next integrator advances one bit, which represents a weight of half of all the bits of the preceding integrator together. This operation results from using carry/borrow bit 434 and carry/borrow bit 437. For example, when integrator 413 (fine word) accumulates to the maximum value represented by its bit width, carry/borrow bit 434 causes the count of integrator 416 to advance by one bit, and so on. A carry or borrow condition results, depending on whether one reaches a maximum positive or negative count, respectively.

Note that the L1 and L2 outputs of NLPD 285 drive integrator 416 and integrator 419, respectively (see FIGS. 5, 6, and 8). NLPD 285 activates the L1 and L2 outputs if the phase errors are relatively large (see the above description of NLPD 285 for more details). When NLPD 285 activates the L1 and L2 outputs, they advance (or retard) the count in, respectively integrator 416 and integrator 419 directly (to provide better acquisition speed), but they also cause activity in the proportional signal path (for improved stability).

Specifically, output signals PPx (labeled as 450), PPa (labeled as 451), PPb (labeled as 452), and PPc (labeled as 453) of digital loop filter 290 represent the proportional signal path outputs, which drive DCO 295. Note that sign_data drives integrator 413 (corresponding to fine word 425), and causes it to advance or retard. Thus, to control the output frequency of DCO 295, digital loop filter 290 drives DCO 295 with proportional signal path outputs as well as integration signal path outputs (i.e., fine word 425, medium word 428, and coarse word 431) that have undergone filtering through digital loop filter 290.

Referring to FIG. 5, DCO 290 provides an output signal 321 whose frequency depends on the output signals of digital loop filter 290. Output signal 321 feeds back to NLPD 285 via divider 300. DCO 290 and divider 300 may have a structure known to persons of ordinary skill in the art who have the benefit of the description of the disclosed concepts. Divider 300 allows NLPD 285 to operate at a frequency lower by a factor of M than the frequency of output signal 321. Note that one may use a desired value of M, depending on factors such as the design and specifications for a particular application, as persons of ordinary skill in the art who have the benefit of the description of the disclosed concepts understand.

Referring to FIG. 5, AD-CDR 205 includes similar components and operates similarly to AD-CMU 275, with some exceptions described below in detail. More specifically, AD-CDR 205 includes phase detector 210, digital loop filter 215, and DCO 220. Digital loop filter 215 and DCO 220 are similar to, or the same as, digital loop filter 290 and DCO 295 of AD-CMU 275, respectively. In illustrative embodiments, DCO 220 constitutes a matched replica of DCO 290. This property of the two DCOs facilitates the operation of the all-digital SerDes, as described below in detail.

An equalizer 200 (or receiver) accepts data in 26, and equalizes or processes the data to generate processed data, and make them available at output 339, in a manner known to persons of ordinary skill in the art who have the benefit of the description of the disclosed concepts.

Phase detector 210 accepts the processed data from output 339. Phase detector 210 produces a sign bit (similar to the sign_data output of NLPD 285, described above), and might include a synchronous clock, as desired. In AD-CDR 205, digital loop filter 215 ignores the L1 and L2 bits from the phrase detector. As a result, phase detector 210 need not generate those outputs. Thus, one may use a bang-bang phase detector, known to persons of ordinary skill in the art who have the benefit of the description of the disclosed concepts, as phase detector 210. Generally speaking, one may use a variety of phase detectors, as persons of ordinary skill in the art who have the benefit of the description of the disclosed concepts understand.

As noted, the sign-bit output of phase detector 210 drives the input of digital loop filter 215. The outputs of digital loop filter 215 drive the control inputs of DCO 220, as described above with respect to matched DCO 295. Output 345 (labeled "Rec. Clock") of DCO 220 feeds back to phase detector 210 (similar to output 321 of DCO 295 feeding back to NLPD 285), thus completing a feedback loop that facilitates the recovery of data.

Phase detector 210 also produces the received data (labeled as "Rec. Data" in FIG. 5) at output 342. The received data drive demultiplexer (DeMUX) 225. Output 345 of DCO 220 drives the select input of DeMUX 225. DeMUX 225 de-serializes the data. As a result of DCO 220 driving DeMUX 225, DeMUX 225 provides n bits of de-serialized data at output 348 to digital control and processing circuit 230. DeMUX 225 also provides a divided receive clock signal (labeled as "RX Div. Clock") to digital control and processing circuit 230 via output 351. Note that DeMUX 225 provides the parallel output data (labeled as "Dout") synchronously with respect to the divided receive clock signal.

DeMUX 235 accepts the de-serialized data and the divided receive clock, and generates n×m bits of output data, which it provides to monitor circuit 240, and also generates a receive clock signal (labeled as "RX Clock"). The receive clock signal serves as a clock signal to monitor circuit 240. Digital control and processing circuit 230 provides the receive clock signal at output 175. The receive clock signal also drives an input of MUX 260.

Monitor circuit 240 constitutes a vector pattern monitor, known to persons of ordinary skill in the art who have the benefit of the description of the disclosed concepts, that validates data integrity. Monitor circuit 240 provides the validated data at output 175. Monitor circuit 240 also provides the validated data to an input of MUX 255. One may implement monitor circuit 240 in a variety of ways (e.g., using gates, flip-flops, and other digital circuits), as desired, and as persons of ordinary skill in the art who have the benefit of the description of the disclosed concepts understand.

The serialization path includes MUX 310 and buffer (or transmitter) 305. MUX 310 accepts n bits of data (labeled as "Din"). Before the serialization process, AD-CMU 275 acquires frequency and phase via the feedback mechanism described above. The parallel data (Din) are generated (as described below in more detail). Together with a divided-down clock (labeled as "TX Div. Clock"), as sourced by AD-CMU 275, the parallel data undergo serialization in MUX 310. The signal at output 321 of DCO 295 of AD-CMU 275 clocks or re-times the data in MUX 310, and provides the resulting data to buffer (or transmitter) 305 via output 354.

The control words of DCO 295 of AD-CMU 275 settle after the acquisition described above has taken place. As noted above, AD-CDR 205 and AD-CMU 275 include matched DCOs (i.e., DCO 220 and DCO 295, respectively). Master/slave (M/S) interface circuit 315 transfers or replicates the control words of DCO 295 in AD-CMU 275 to matched DCO 220 in AD-CDR 205, effectively eliminating the frequency acquisition step in AD-CDR 205, and leaving any phase corrections for AD-CDR 205 to complete. The process of replicating the DCO control words from AD-CMU 275 to AD-CDR 205 occurs via M/S interface 315, once enabled via output 357 of PLL lock detect and M/S enable circuit 270 in digital control and processing circuit 230.

Given that AD-CMU 275 acquires and synthesizes the appropriate frequencies for a given application and data rate, in one exemplary embodiment, M/S interface circuit 315 copies the control word bits from digital loop filter 290 in AD-CMU 275 to digital loop filter 215 in AD-CDR 205 as a pre-load operation, before allowing the data to cause changes to the control words in digital loop filter 215 of AD-CDR 205. As described above in detail, the various words (e.g., fine, medium, etc.) in digital loop filter 290 and in digital filter 215 control, respectively, the output frequency of DCO 295 and DCO 220.

As noted above, during normal operation, AD-CMU 275 uses a reference clock. AD-CDR 205 starts to accept data after M/S interface circuit 315 transfers the DCO control words from AD-CMU 275 to AD-CDR 205. After AD-CMU 275 has acquired, PLL lock detect and M/S enable circuit 270 senses the acquisition, and provides an enable signal at output 357, thus enabling M/S interface circuit 315. The PLL lock portion of PLL lock detect and M/S enable circuit 270 provides a conventional lock-detect function (by examining the signal at output 233 of divider 300 and the signal at output 318 of buffer 280), as persons of ordinary skill in the art who have the benefit of the description of the disclosed concepts understand. One may implement PLL lock detect and M/S enable circuit 270 in a variety of ways (e.g., using gates, comparators, flip-flops, and other digital circuits), as desired, and as persons of ordinary skill in the art who have the benefit of the description of the disclosed concepts understand.

The enable signal causes M/S interface circuit 315 to load registers in AD-CDR 205 via a pre-load operation, described above. Note that matched DCOs (i.e., DCO 295 matched relatively well to DCO 220) allows the pre-load operation to occur as a simple register read/write operation.

MUX 255 and MUX 260 allow selecting the input data that undergo the serialization process. Specifically, MUX 255 and MUX 260 may select as input data either data at input 170, or data available at output 175 as a loop-back operation. Regardless of the source of the data, MUX 255 and MUX 260 provide the data to first-in, first-out (FIFO) buffer 250.

FIFO 250 buffers the data, and provides the buffered data to generator circuit 245. One may implement FIFO 250 in a variety of ways (e.g., using gates, flip-flops, registers, and other digital circuits), as desired, and as persons of ordinary skill in the art who have the benefit of the description of the disclosed concepts understand.

The divided-down clock signal clocks FIFO 250 and generator circuit 245. Generator circuit 245 constitutes a vector pattern generator used to validate data integrity, as persons of ordinary skill in the art who have the benefit of the description of the disclosed concepts understand. At its output, generator circuit 245 provides n×m bits of data to MUX 242. MUX 242 couples to, and provides the data to, MUX 310, which performs the serialization process. One may implement generator circuit 245 in a variety of ways (e.g., using gates, flip-flops, and other digital circuits), as desired, and as persons of ordinary skill in the art who have the benefit of the description of the disclosed concepts understand.

PPM detect circuit 265 serves as a monitoring circuit. It monitors the difference between the relatively solid divided-down clock signal at node 324 and the receive clock signal (labeled as "RX Clock" in FIG. 5). Put another way, PPM detect circuit 265 compares the clock signal from AD-CMU 275 to the clock signal that AD-CDR 205 recovers from the data. If the difference between the two clocks exceeds a prescribed or pre-determined threshold, PPM detect circuit 265 flags that condition via output 360. A flag at output 360 may indicate, among other things, that the communication link has degraded or has started degrading or dropping. One may implement PPM detect circuit 265 in a variety of ways (e.g., using gates, comparators, flip-flops, and other digital circuits), as desired, and as persons of ordinary skill in the art who have the benefit of the description of the disclosed concepts understand.

Another aspect of the disclosed concepts relates to all-digital oversampling SerDes. This type of SerDes uses an AD-CMU and digital control/processing circuitry similar to (or substantially similar to) AD-CMU 275 and digital control and processing circuit 230, respectively, described above. It uses a different type of AD-CDR (i.e., an oversampling AD-CDR) than AD-CDR 205, described above. In addition, it uses a phase generating delay-locked loop (DLL) circuit not present in the SerDes described above in connection with FIG. 5.

Figure 9:
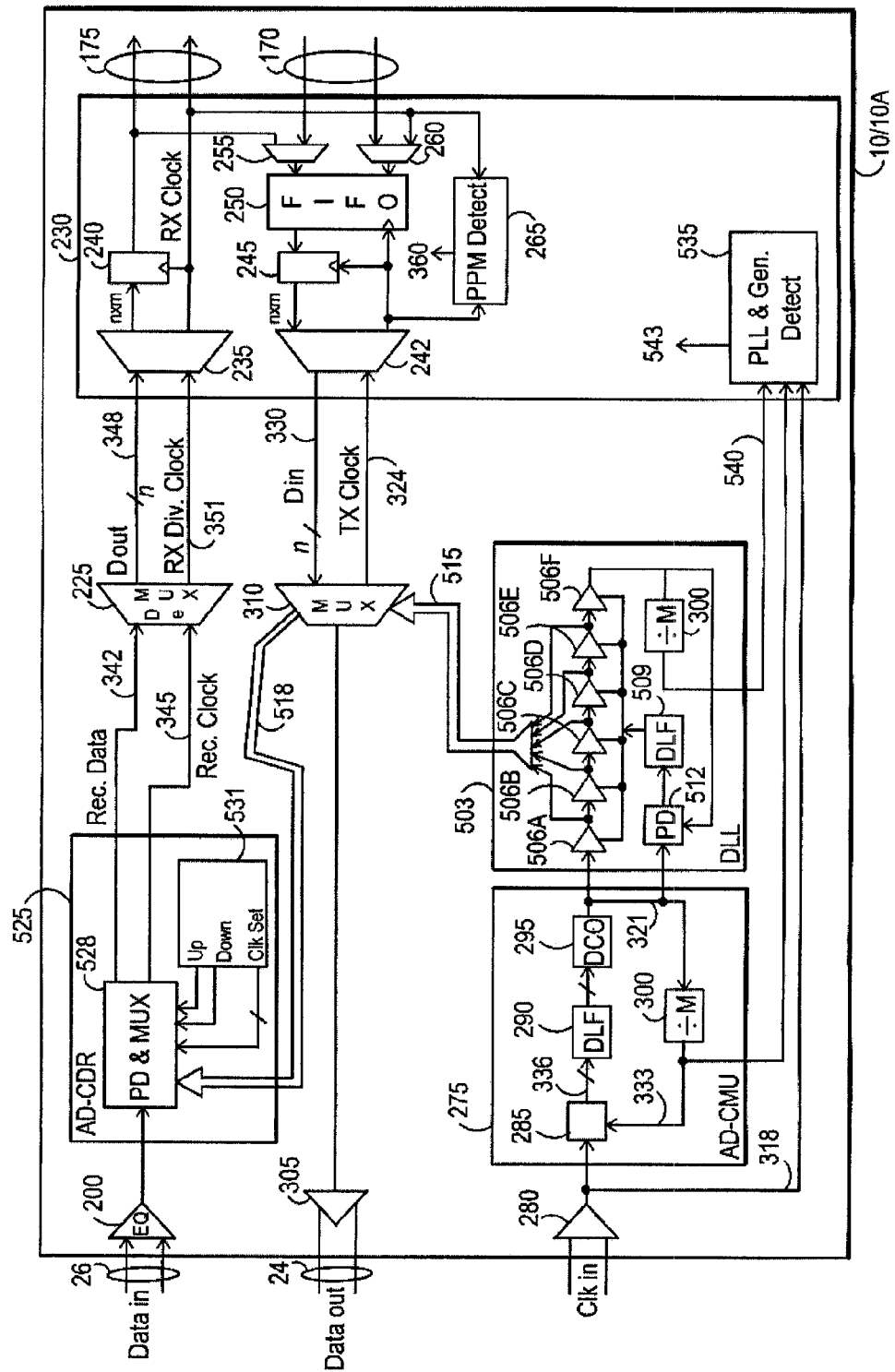
FIG. 9 depicts a simplified block diagram of an all-digital oversampling SerDes according to an exemplary embodiment.

FIG. 9 shows a simplified block diagram of an all-digital oversampling SerDes according to an exemplary embodiment. In addition to the blocks and circuitry described above, it includes oversampling AD-CDR 525 and phase generating DLL 503. The rest of the circuitry operates as described above, with the exceptions noted below.

Note that AD-CDR 525 does not use a DCO. Instead, it uses a phase detector 528 and digital loop filter 531. As a consequence, AD-CDR 525 does not use a master/slave interface circuit (see M/S interface circuit 315). Rather, it uses a different acquisition process that entail no training.

More specifically, oversampling AD-CDR 525 accepts a set of equally spaced multiple phases (generated by phase generating DLL 503, described below in detail) as stressed or controlled by digital loop filter 531 in order to achieve acquisition and recover the data and clock signal.

Put another way, oversampling AD-CDR 525 relies on the multiple phases received via signal link 518 to achieve acquisition. To do so, oversampling AD-CDR 525 selects the correct phase from the multiple phases near the middle of the recovered signal eye. Oversampling AD-CDR 525 constantly and repeatedly checks the phase error and selects the appropriate sampling phase from the multiple phases received via signal link 518 in order to achieve a better (or improved or best) performance. One may determine the level of performance through a variety of performance measures or criterion, such as bit error rate performance, and the like, as persons of ordinary skill in the art who have the benefit of the description of the disclosed concepts understand.

Generally, one may implement AD-CDR 525 in a variety of ways, and with a desired architecture. As one example, one may use AD-CDR 525 as described in detail in U.S. patent application Ser. No. 11/716,229 (see for example FIGS. 3-6 and the accompanying description), referenced above, and incorporated by reference in this document.

Phase generating DLL circuit 503 uses the signal at output 321 of AD-CMU 275 to feed a multi-stage DLL that includes programmable delay circuits 506A-506F (e.g., as implemented with multiplexers or other desired circuitry) coupled in a series or cascade configuration, known to persons of ordinary skill in the art who have the benefit of the description of the disclosed concepts. Note that one may use more buffers/delay elements to provide more resolution in the CDR system by decreasing the spacing between samples, as desired. The number of buffers/delay elements depends on the design and specifications for a particular implementation, as persons of ordinary skill in the art who have the benefit of the description of the disclosed concepts understand.

Phase generating DLL circuit 503 produces a set of five signals with staggered or differing, but equally spaced, phases from one another. It provides the collective set of phases via output 515 to PD 528 via way of MUX 310. MUX 310 usually utilizes the middle phase, but can take any arbitrary phase (e.g., one of the other phases) for use in synchronous transmission of the serialized data to transmitter 305, while also providing a divided-down clock, i.e., TX Clock 324 to synchronously clock the release of data from digital control and processing circuit 230. This high-speed clock then couples to oversampling AD-CDR 525 via signal link (e.g., bus) 518.

AD-CDR 525 uses the multiple phases in its oversampling operation in order to achieve acquisition and recover the data and clock signal. Each of the five phases corresponds to an output signal of one of programmable delay circuits 506A-506E. For example, the first phase constitutes the output signal of programmable delay circuit 506A, the second phase constitutes the output signal of programmable delay circuit 506A, and so on. Thus, the fifth phase constitutes the output signal of programmable delay circuit 506E.

Note that, rather than using six programmable delay circuits, as shown, one may use other numbers of programmable delay circuits, as desired, by making modifications to the circuitry shown. Furthermore, rather than using programmable delay circuits, one may use controlled buffers or controlled inverters, as desired. In addition, rather than using five signals or phases, one may use other numbers of signals/phases, as desired, by making modifications to the circuitry shown. All of the modifications fall within the knowledge of persons of ordinary skill in the art who have the benefit of the description of the disclosed concepts.

Phase generating DLL circuit 503 adaptively spreads the multiple phases at outputs 515. Specifically, it uses phase detector 512 and digital loop filter 509 coupled in a feedback loop to control desired characteristics of programmable delay circuits 506A-506F (e.g., delay, speed). Phase detector 512 compares the phases of the signal at output 321 of AD-CMU 275 with the phase of the output signal of programmable delay circuit 506F to generate a phase error signal.

Digital loop filter 509 couples to phase detector 512, and uses the phase error signal to generate one or more control signals to control programmable delay circuits 506A-506F. The control signals cause the spreading (or contracting) of the multiple phases, based on feedback control. One may implement phase detector 512 and digital loop filter 509 using a variety of designs, as desired, and as persons of ordinary skill in the art who have the benefit of the description of the disclosed concepts understand. The description below (e.g., FIG. 10) provides details of one possible implementation in an exemplary embodiment.

As noted above, MUX 310 generally uses (but need not necessarily do so) the middle phase among the multiple phases as the divided-down clock signal (labeled as "TX Clock") at node 324. The all-digital SerDes uses the divided-down clock signal to perform the serialization process, and also drive some of the circuitry in digital control and processing circuit 230, as described above.

As noted, oversampling AD-CDR uses the multiple phases generated by phase generating DLL circuit 503, as provided by signal link 518. Phase detector/MUX 528 received the multiple phases from MUX 310 via signal link 518. Digital loop filter 531 provides a set of clock signals (labeled as "Clk Set") to phase detector/MUX 528. In addition, digital loop filter 531 provides a pair of signals (labeled as "Up" and "Down") to phase detector/MUX 528. Based on the set of clock signals and the "Up" and "Down" signals, phase detector/MUX 528 selects and uses one of the multiple phases that phase generating DLL circuit 503 provides via MUX 310 so as to achieve acquisition.

In the embodiment shown, digital loop filter 531 uses shift registers for its implementation. Note, however, that one may use a variety of circuitry and designs to implement digital loop filter 531 and phase detector/MUX 528, as desired, and as persons of ordinary skill in the art who have the benefit of the description of the disclosed concepts understand.

Note that phase generating DLL circuit 503 may have associated with it a relatively large time constant. To check the lock condition, PLL and generator detect circuit 535 monitors a divided-down version of the output signal of programmable delay circuit 506F (as available at output 540 of divider 300) with a divided-down version of the output signal of AD-CMU 275 (as available at output 333 of divider 300). Based on a desired criteria (e.g., a threshold value), PLL and generator detect circuit 535 provides a flag or output signal at output 543 as a measure of the lock condition between AD-CMU 275 and phase generating DLL circuit 503. One may implement PLL and generator detect circuit 535 in a variety of ways (e.g., using gates, comparators, flip-flops, and other digital circuits), as desired, and as persons of ordinary skill in the art who have the benefit of the description of the disclosed concepts understand.

One aspect of the disclosed concepts relates to all-digital DLLs. All-digital DLLs provide more robust operation over conventional analog counterparts (e.g., a DLL including a phase detector, current sources, and a capacitor as the loop filter). A DLL used in an all-digital SerDes operates in a relatively hostile operating environment, which causes it to experience supply and substrate noise (from other switching and digital circuitry, etc.). The noise can worsen the clock jitter, which in turn degrades timing margins. The all-digital nature of the DLL circuitry disclosed here makes them relatively resistant or immune to noise, compared to its conventional analog counterparts. One may use the disclosed all-digital DLLs in phase generating and DLL circuit 503, described above.

Figure 10:
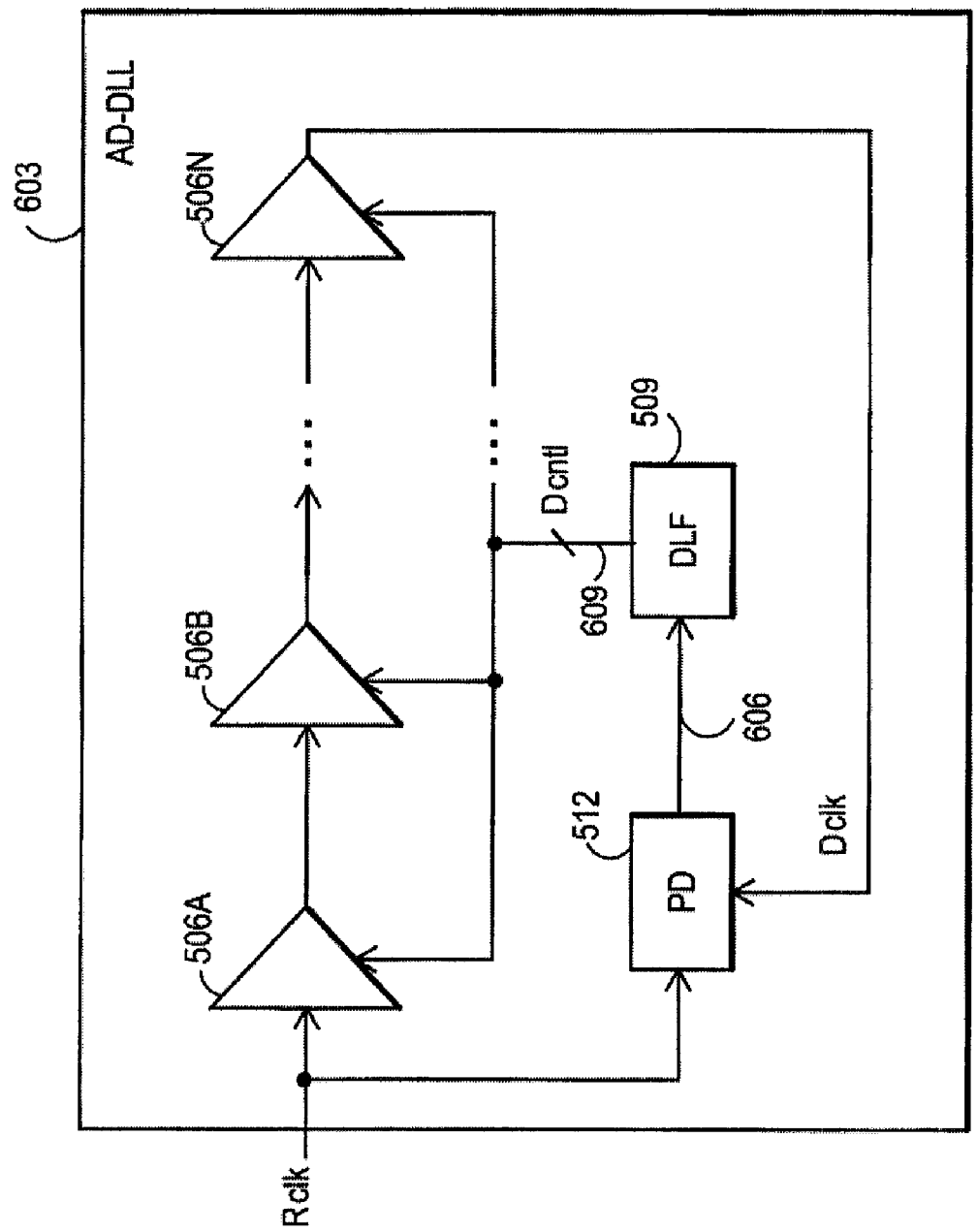
FIG. 10 shows a simplified block diagram of an all-digital DLL according to an exemplary embodiment.

FIG. 10 shows a simplified block diagram of an all-digital DLL (AD-DLL) 603 according to an exemplary embodiment. AD-DLL 603 includes a set of N programmable delay circuits 506A-506N, where N denotes a positive integer, digital phase detector 512, and digital loop filter 509.

Although the description of AD-DLL 603 refers to programmable delay circuits 506A-506N, one may use other types of circuitry, as desired, and as persons of ordinary skill in the art who have the benefit of the description of the disclosed concepts understand. For example, one may use controlled buffers or controlled inverters, as desired, by making modifications to the circuitry shown. The modifications fall within the knowledge of persons of ordinary skill in the art who have the benefit of the description of the disclosed concepts.

AD-DLL 603 uses programmable delay circuits 506A-506N coupled in a cascade or series fashion to implement delay stages. Put another way, the output of programmable delay circuit 506A feeds the input of programmable delay circuit 506B, whose output drives the input of programmable delay circuit 506C (not shown explicitly), and so on. Finally, the (N-1)st stage, programmable delay circuit 506(N-1) (not shown explicitly) drives the input of programmable delay circuit 506N. The output of programmable delay circuit 506N, effectively a delayed clock signal (labeled "Dclk"), drives an input of phase detector 512.

A reference clock, labeled "Rclk," drives the input of first programmable delay circuit 506A. The reference clock also drives a second input of phase detector 512. Phase detector 512 compares the respective phases of the Rclk signal and the Dclk signal to generate a phase error signal at output 606. The phase error signal drives the input of digital loop filter 509.

Digital loop filter 509 produces a control word, labeled "Dcntl," at its output. The control word couples to a control input of each programmable delay circuit 506A-506N. The control word provides for varying the operating characteristics of programmable delay circuits 506A-506N. For example, in the case of programmable delay circuits, the control word can change or program the delay of programmable delay circuits 506A-506N. As another example, suppose that AD-DLL 603 uses controlled inverters instead of programmable delay circuits. In that case, the control word can change the operating speed (or delay or gain) in each inverter. A similar situation holds true when AD-DLL 603 uses controlled buffers instead of programmable delay circuits.

Note that AD-DLL 603 employs negative feedback in a feedback loop that includes programmable delay circuits 506A-506N, phase detector 512, and digital loop filter 509. Because of the negative feedback, the digital loop filter 509 produced control words (Dcntl) that change the operating characteristics of programmable delay circuits 506A-506N so as to reduce the phase error at output 606 of phase detector 512. Thus, the negative feedback causes a lock between the Rclk signal and the Dclk signal. In other words, the output of programmable delay circuit 506N locks to, and tracks, the reference clock, Rclk.

Figure 11:
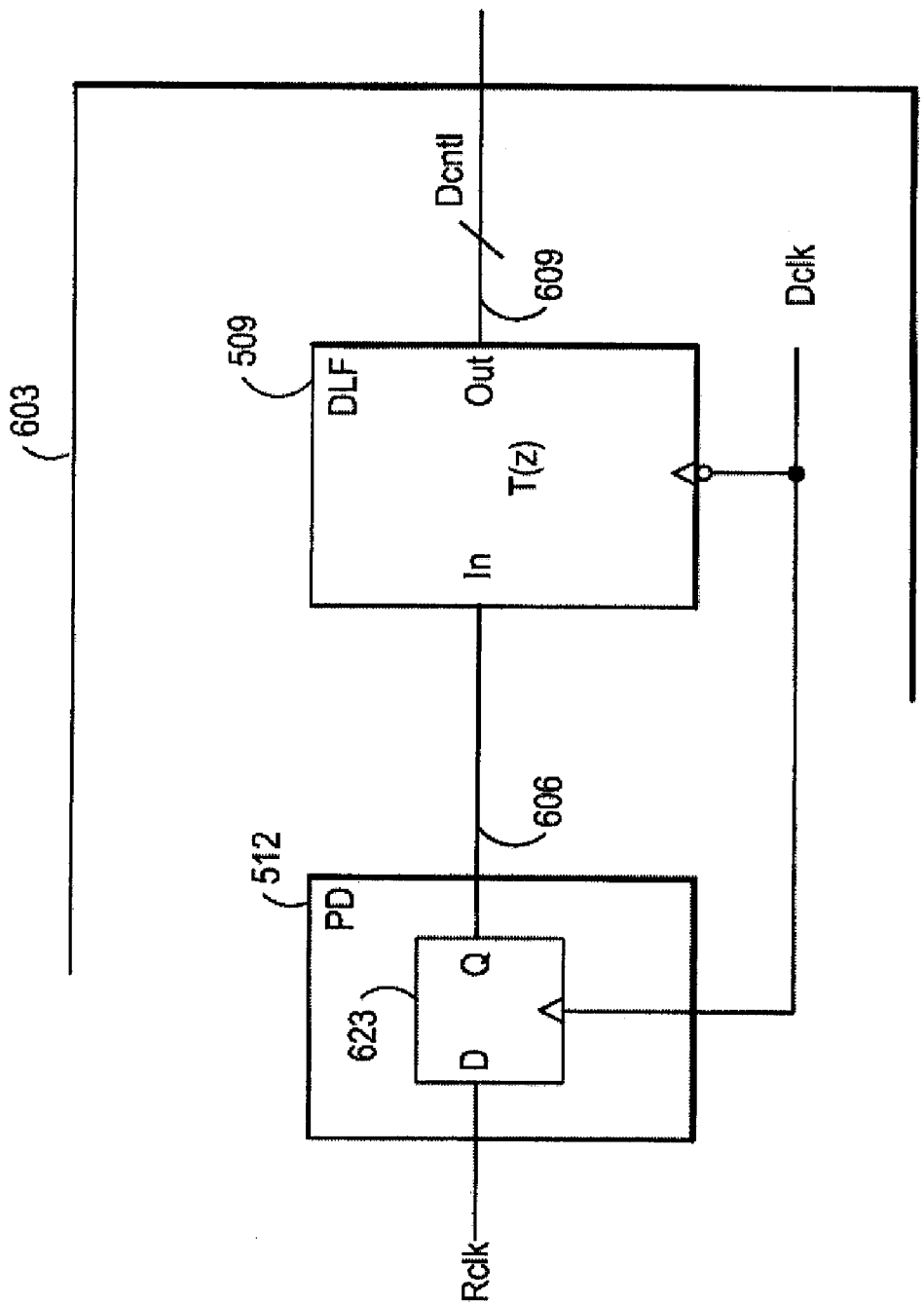
FIG. 11 illustrates a simplified block diagram of the phase detector and the digital loop filter in an illustrative embodiment of an all-digital DLL (AD-DLL).

One may implement phase detector 512 and digital loop filter 509 in a variety of ways, as persons of ordinary skill in the art who have the benefit of the description of the disclosed concepts understand. FIG. 11 shows a simplified block diagram of phase detector 512 and digital loop filter 509 in an illustrative embodiment. In the embodiment shown, phase detector 512 constitutes a bang-bang phase quantizer circuit, implemented as D flip-flop 623. Note that flip-flop 623 represents a relatively simple implementation of the quantizer circuit. As persons of ordinary skill in the art who have the benefit of the description of the disclosed concepts understand, however, one may use other types or implementations of quantizer circuits (or phase detectors, generally), as desired. Digital loop filter 509 includes a digital filter, having a transfer function T(z), described below in detail.

The signal Dclk, i.e., the output of programmable delay circuit 506N in the cascade coupling of programmable delay circuits 506A-506N (not shown explicitly), drives the clock inputs of D flip-flop 623 (clocked on rising edges) and digital loop filter 509 (clocked on falling edges). The Q output of D flip-flop 623 drives the input of digital loop filter 509.

Digital loop filter 509 performs integration in the feedback loop according to the z-domain transfer function:

$$T(z) = \frac{\alpha}{(1-\rho Z^{-1})}.$$

In the above transfer function, $\alpha$ and $\rho$ denote gain coefficients, and $Z^{-1}$ represents a unit delay. One may implement digital loop filter 509 using a variety of circuit blocks, and using appropriate coefficients $\alpha$ and $\rho$, to provide desired pole and zero locations. The choice of circuit elements and filter coefficients depend on the design and specifications for a given application, as persons of ordinary skill in the art who have the benefit of the description of the disclosed concepts understand. Furthermore, note that the above transfer function describes one way of implementing digital loop filter 509. One may implement digital loop filter 509 using a variety of other techniques, as desired. For example, one may use a more complex, multi-order digital filter, depending on the desired roll-off characteristics. The choice of filter implementation depends on the design and specifications for a particular application, as persons of ordinary skill in the art who have the benefit of the description of the disclosed concepts understand.

Figure 12:
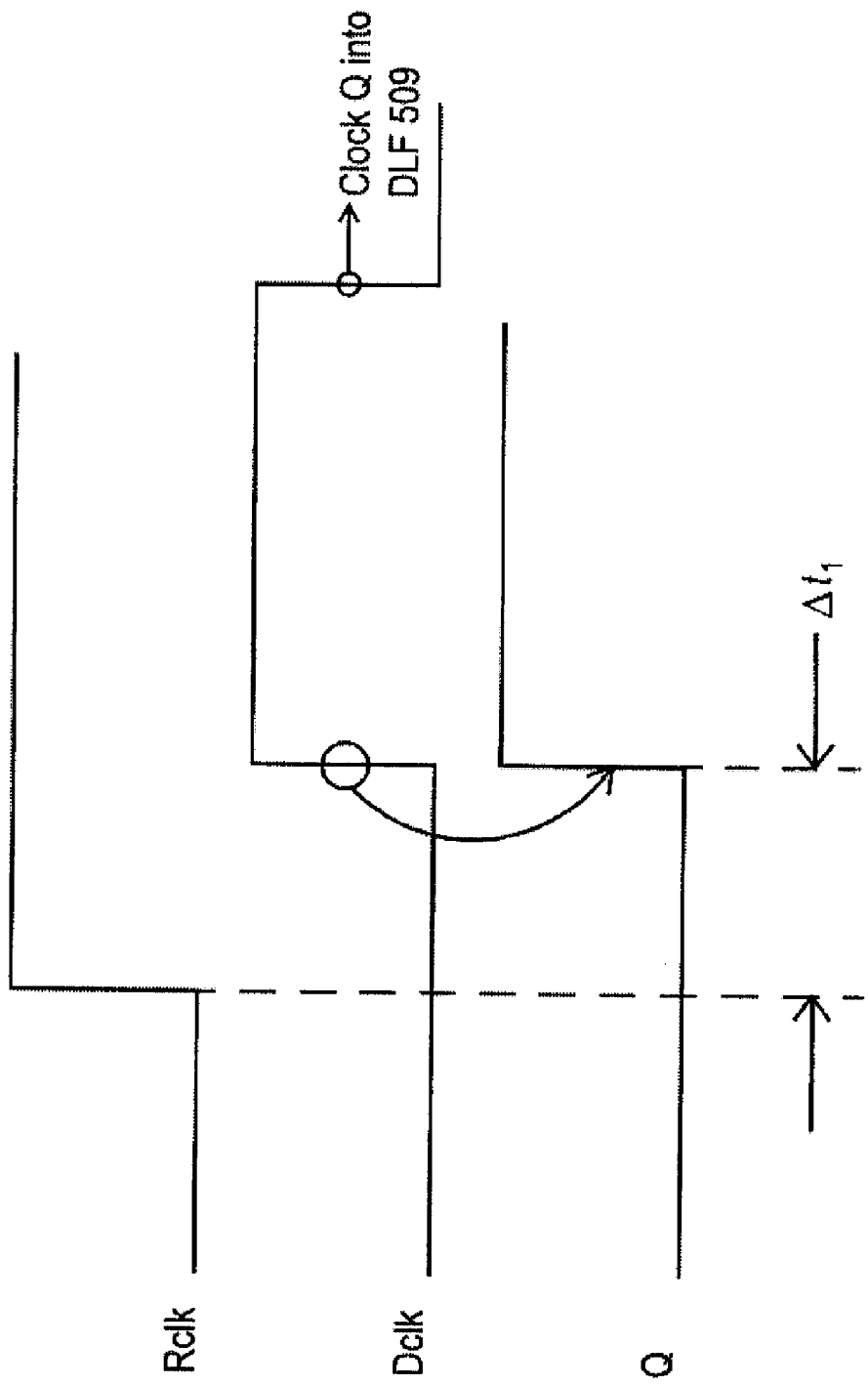
FIG. 12 depicts a timing diagram of the operation of the phase detector in an illustrative embodiment of the AD-DLL.

Phase detector 512 and digital loop filter 509 quantize the phase error and generate the control word as follows: Suppose that the reference clock signal, Rclk, leads the delayed clock signal, Dclk by a time period $\Delta t_1$. In that situation, application of the clock signal Dclk (rising edge) causes the Q output of flip-flop 623 to have a logic one value (i.e., binary one). On the falling edge of the clock signal Dclk, the logic one value at the Q output of flip-flop 623 clocks into digital loop filter 509. FIG. 12 shows a timing diagram that illustrates this scenario.

Figure 13:
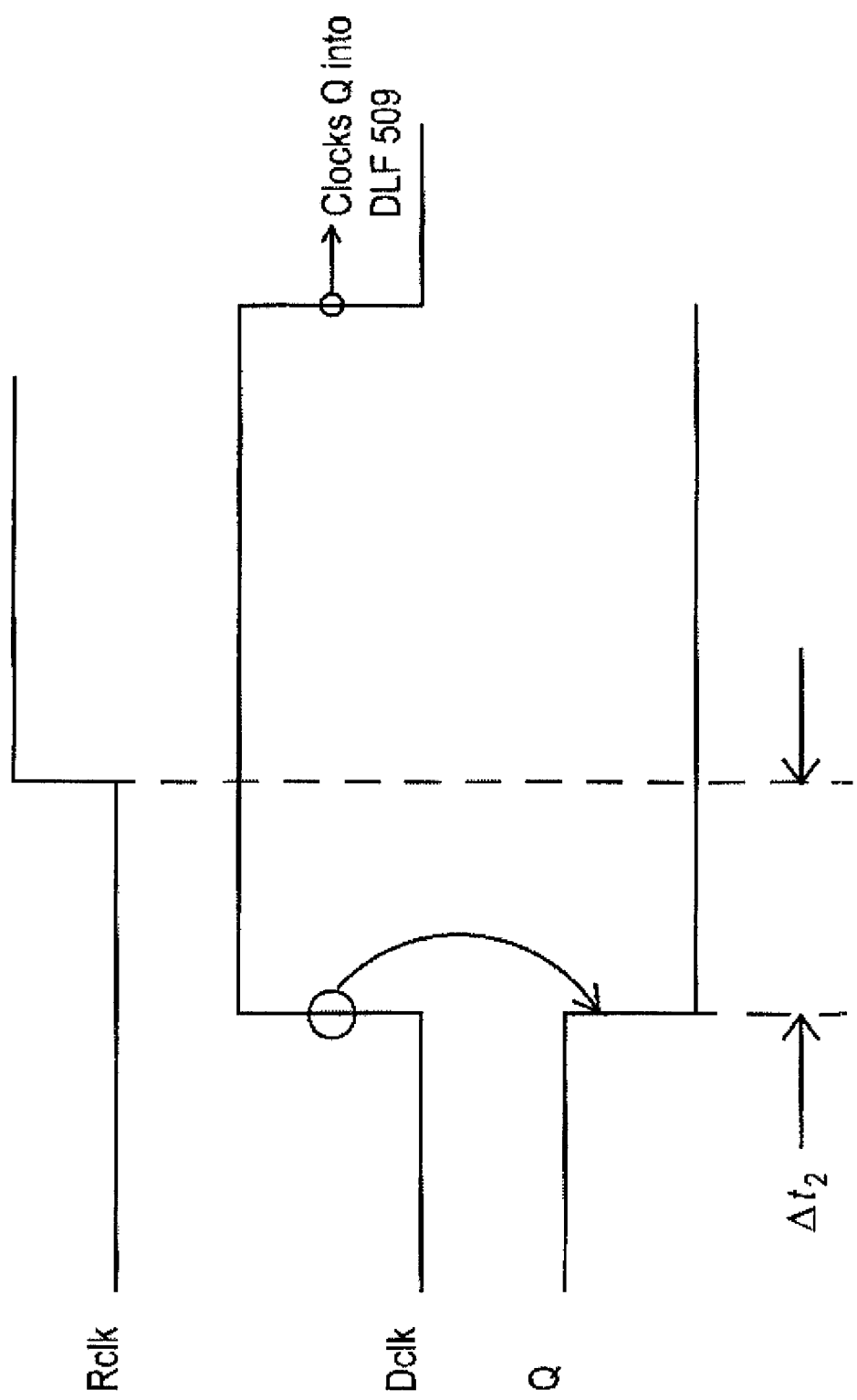
FIG. 13 shows another timing diagram of the operation of the phase detector in an illustrative embodiment of the AD-DLL.

If, on the other hand, consider the situation where the reference clock signal, Rclk, lags the delayed clock signal, Dclk by a time period $\Delta t_2$. In this case, application of the clock signal Dclk (rising edge) causes the Q output of flip-flop 623 to have a logic zero value (i.e., binary zero). On the falling edge of the clock signal Dclk, the logic zero value at the Q output of flip-flop 623 clocks into digital loop filter 509. FIG. 13 shows a timing diagram that depicts this scenario.

The architecture described above assumes that the clock signals used have an approximate 50% duty cycle (fairly common and expected in typical application). With that assumption fulfilled, one may represent the characteristics phase detector 512 as a step function from $-\pi$ to $+\pi$, with the step occurring at zero radians (or at the origin). If the clock signals do not satisfy the 50% duty cycle assumption, the operation of AD-DLL 603 remains intact, albeit with a reduced range of operation.

Figure 14:
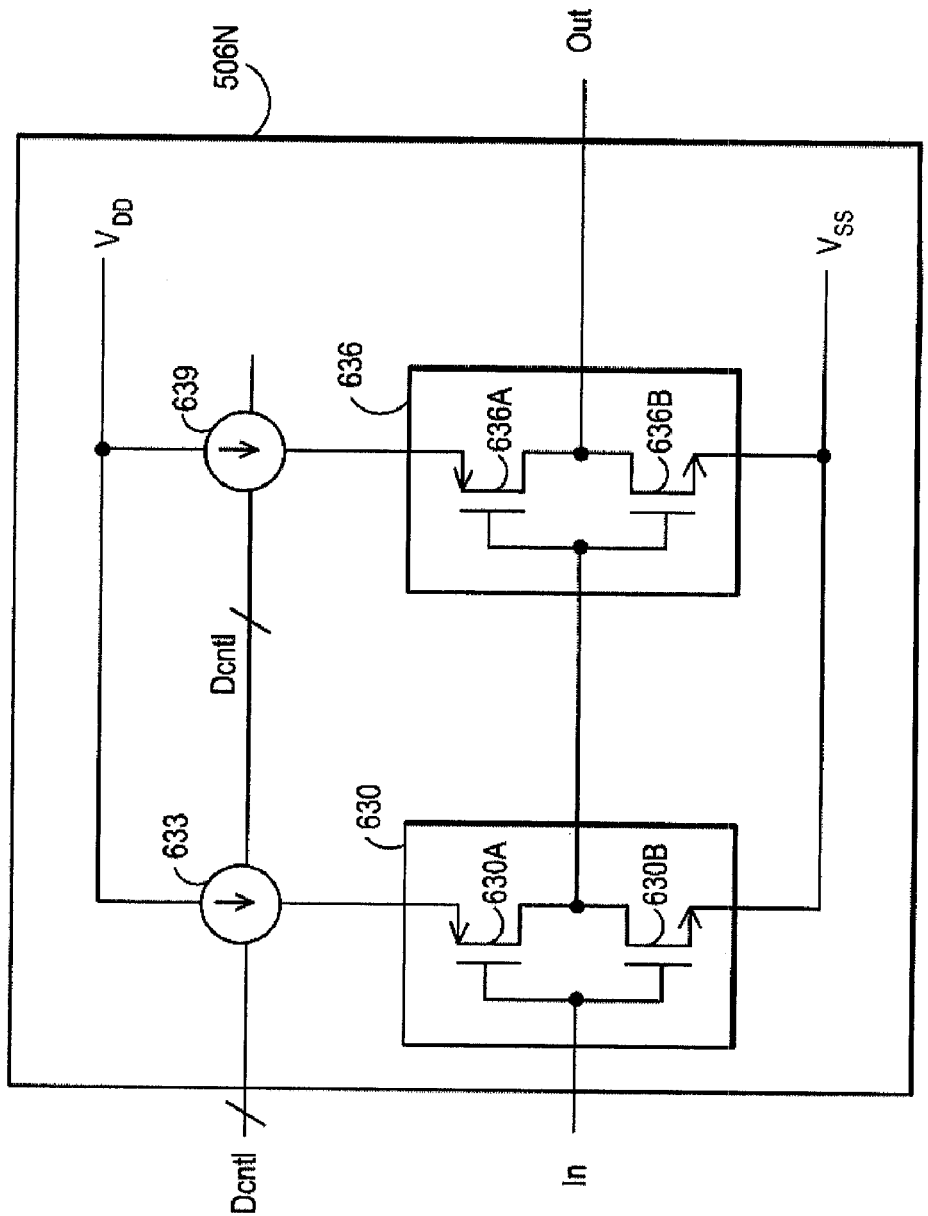
FIG. 14 illustrates a simplified circuit diagram of one the programmable delay circuits of the AD-DLL according to an illustrative embodiment.

As noted above, one may use a variety of implementations of programmable delay circuits 506A-506N. FIG. 14 shows a simplified circuit diagram of one of programmable delay circuits 506A-506N according to an illustrative embodiment. To facilitate the presentation, the following description assumes that FIG. 14 shows programmable delay circuit 506N, although a similar description applies to programmable delay circuits 506A-506(N−1), as persons of ordinary skill in the art who have the benefit of the description of the disclosed concepts understand.

Programmable delay circuit 506N includes a pair of cascaded inverters, i.e., inverter 630 coupled to inverter 636, current source or mirror 633, and current source or mirror 639. The inverters have a structure familiar to persons of ordinary skill in the art. Thus, inverter 630 includes P-type transistor 630A coupled to P-type transistor 630B, whereas inverter 636 includes P-type transistor 636A coupled to P-type transistor 636B.

The input signal of programmable delay circuit 506N drives the input of inverter 630. The output of inverter 630 drives the input of inverter 636. The output of inverter 636 drives the output of programmable delay circuit 506N.

Inverter 630 and inverter 636 receive their supply power from the supply lines labeled "$V_{DD}$" and "$V_{SS}$." More specifically, inverter 630 and inverter 636 receive power from the positive supply rail (i.e., $V_{DD}$) via current source 633 and current source 639, respectively. Current source 633 and current source 639 constitute digitally programmable current sources.

Put another way, the digital value of the control word, Dcntl, programs or adjusts the amount of current that current source 633 and current source 639 supply to inverter 630 and inverter 636, respectively. Thus, by varying the value of the control word, Dcntl, one may vary the amount of power that inverter 630 and inverter 636 receive. As a result, one may change the speed of operation or delay of inverter 630 and inverter 636, hence the delay in programmable delay circuit 506N, by setting or modifying the value of the control word, Dcntl.

Coupling programmable delay circuits 506A-506N in a cascade configuration creates a circuit that provides a programmable overall delay from its input (i.e., the input of programmable delay circuit 506A) to its output (i.e., the output of programmable delay circuit 506N). Thus, by selecting an appropriate number of programmable delay circuits (i.e., the value of N) and by programming the value of the control word, Dcntl, one may achieve a desired overall delay in the chain of programmable delay circuits 506A-506N.

Note that one may implement the control word, Dcntl, with any desired number of bits. The appropriate number of bits depends on the desired resolution in the programmability of the delay of programmable delay circuits 506A-506N for a particular application, as persons of ordinary skill in the art who have the benefit of the description of the disclosed concepts understand.

By tapping the outputs of programmable delay circuits 506A-506(N−1) (see FIG. 10), one may generate N−1 equally spaced phases, i.e., multiple phases at the frequency of the reference clock, Rclk.

Figure 15:
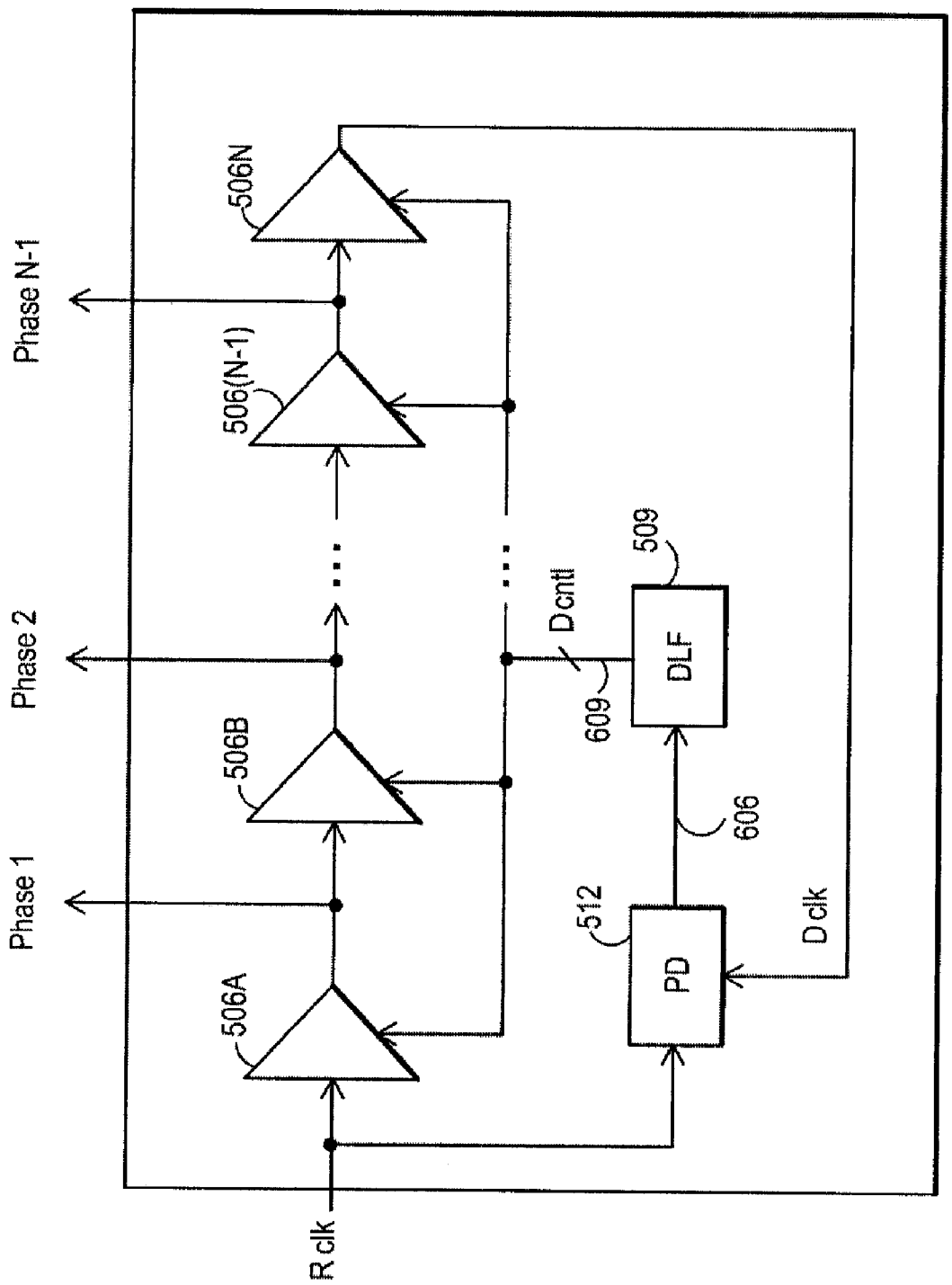
FIG. 15 depicts a simplified circuit arrangement according to an exemplary embodiment for a multiple phase generating DLL.

FIG. 15 shows that arrangement added to the circuit in FIG. 10. Specifically, a tap at the output of programmable delay circuit 506A produces phase 1 of the multiple phases, a tap at the output of programmable delay circuit 506B generates phase 2 of the multiple phases, and so on.

Note that the circuit in FIG. 15 produces not only multiple phases, but also equally spaces the phases with respect to one another across a data interval. Phase detector 512 and digital loop filter 509 facilitate not only the generation of equally spaced multiple phases, but also the spreading or contracting of the spacing among the multiple phases.

Specifically, coupling programmable delay circuits 506A-506N in a cascade configuration forces the generation of equally spaced phases across a single data unit interval (UI). As noted above, the circuit arrangement uses N programmable delay circuits (i.e., 506A-506N) to generate N−1 phases (i.e., phase 1, phase 2, . . . , and phase N−1, as FIG. 15 illustrates). FIG. 16 shows the timing relationship for five phases (i.e., N=6, resulting in phases 1-5).

The input or reference clock, Rclk, constitutes the reference signal by which the phase alignment of the entire generation process takes place. As noted above, the output of programmable delay circuit 506N feeds back to phase detector 512, and by virtue of the phase comparison in phase detector 512 closes and stresses the feedback loop so as to produce equally spaced alignment of the phases, as spaced according to the number of buffers used.

Note that, despite their all-digital circuitry, the delay in programmable delay circuits 506A-506N will change because of variations in process, voltage, temperature, etc. Coupling programmable delay circuits 506A-506N in a feedback loop, however, automatically compensates for the changes by virtue of the negative feedback.

One may apply the disclosed concepts effectively to general-purpose ICs, or various ICs that include programmable or configurable logic circuitry, which may be known by other names in the art, as desired, and as persons skilled in the art with the benefit of this disclosure understand. Examples of such circuitry include devices known as complex programmable logic device (CPLD), programmable gate array (PGA), and field programmable gate array (FPGA).

The disclosure also includes other aspects of all-digital serializer-de-serializers. In a first exemplary embodiment, an all-digital serializer-de-serializer, comprises an all-digital clock multiplier unit (CMU) circuit; an all-digital oversampling clock and data recovery (CDR) circuit coupled to the all-digital clock multiplier unit (CMU) circuit; and an all-digital delay-locked loop (DLL) circuit that generates a set of multiple phase signals. The all-digital serializer-de-serializer may further comprise a multiplexer (MUX), coupled to all-digital clock multiplier unit (CMU) circuit, configured to serialize data; and a demultiplexer (DeMUX), coupled to the all-digital oversampling clock and data recovery (CDR) circuit, configured to de-serialize data. The all-digital clock multiplier unit (CMU) circuit comprises a first phase detector that accepts a first signal. The first phase detector compares a phase of the first signal with a phase of a second signal to generate a phase error signal. The all-digital clock multiplier unit (CMU) circuit further comprises a first digital loop filter coupled to the first phase detector. The all-digital clock multiplier unit (CMU) circuit further comprises a first digitally controlled oscillator coupled to the digital loop filter. The all-digital clock and data recovery (CDR) circuit further comprises a second phase detector. The all-digital clock and data recovery (CDR) circuit further comprises a second digital loop filter coupled to the second phase detector.

Referring to the first exemplary embodiment above, the all-digital oversampling clock and data recovery (CDR) circuit uses the set of multiple phase signals to acquire clock and data signals from a set of received signals. In the first exemplary embodiment above, the all-digital delay-locked loop (DLL) circuit comprises a plurality of programmable delay circuits. In the first exemplary embodiment above, the all-digital delay-locked loop (DLL) circuit comprises a plurality of controlled buffers. In the first exemplary embodiment above, the all-digital delay-locked loop (DLL) circuit comprises a plurality of controlled inverters. In the first exemplary embodiment above, the all-digital serializer-de-serializer further comprises a digital control circuit coupled to the all-digital clock multiplier unit (CMU) circuit and the all-digital clock and data recovery (CDR) circuit.

In a second exemplary embodiment, a programmable logic device (PLD), comprises a serializer-de-serializer circuit, which comprises an all-digital clock multiplier unit (CMU) circuit; an all-digital oversampling clock and data recovery (CDR) circuit coupled to the all-digital clock multiplier unit (CMU) circuit; and an all-digital delay-locked loop (DLL) circuit coupled to the oversampling clock and data recovery (CDR) circuit. The PLD further comprises a multiplexer (MUX) coupled to the all-digital clock multiplier unit (CMU) circuit. The multiplexer (MUX) serializes data to generate serialized data signals. The serialized data signals comprise differential signals, low voltage differential signals (LVDS), or single-ended signals.

Referring to the second exemplary embodiment above, the PLD further comprises a demultiplexer (DeMUX) coupled to the oversampling all-digital clock and data recovery (CDR) circuit. The demultiplexer (DeMUX) de-serializes data to generate de-serialized data signals. The de-serialized data signals comprise differential signals, low voltage differential signals (LVDS), or single-ended signals.

Referring to the second exemplary embodiment above, the all-digital delay-locked loop (DLL) circuit generates a plurality of output signals. Further referring to the second exemplary embodiment above, the oversampling all-digital clock and data recovery (CDR) circuit comprises a phase detector; and a digital loop filter coupled to the phase detector, wherein the digital loop filter causes the phase detector to use one signal in the plurality of output signals of the all-digital delay-locked loop (DLL) circuit to acquire data and clock signals.

In a third exemplary embodiment, a method of processing signals in an integrated circuit (IC) comprises digitally producing a multiplied clock signal from a reference clock signal; and digitally acquiring data and clock signals from a first set of data signals, to generate acquired data signals and acquired clock signal, by using one signal from a plurality of phase-related signals. More particularly, the method further comprises digitally de-serializing the acquired data signals. More particularly, the method further comprises digitally serializing a second set of data signals, by using the multiplied clock signal, to generate serialized data signals. The method further comprises transmitting the serialized data signals via a single-ended signal link, or a differential signal link.

Referring to the third exemplary embodiment above, the method further comprises monitoring a lock between the reference clock signal and a clock signal obtained by dividing down the multiplied clock signal. Referring to the third exemplary embodiment above, digitally producing the multiplied clock signal from the reference clock signal comprises digitally generating a first signal used to produce the multiplied clock signal. Referring to the third exemplary embodiment above, the plurality of phase-related signals have equally spaced phases with respect to one another. Referring to the third exemplary embodiment above, the method further comprises equalizing the first set of data before digitally acquiring data and clock signal. Referring to the third exemplary embodiment above, the first set of data signals comprises single-ended signals or differential signals.

Another aspect of the disclosure relates to apparatus and methods for generating signals with particular or desired phase relationships. In a fourth exemplary embodiment, an apparatus comprises a plurality (N) of digital delay circuits coupled in a cascade configuration; a digital phase detector coupled to the plurality of digital delay circuits; and a digital loop filter, coupled to the digital phase detector, that controls the plurality of digitally-controlled delay elements. Each programmable digital delay circuit comprises first and second digitally controlled current sources that produce, respectively, first and second currents in response to the control word.

Referring to the fourth exemplary embodiment above, each delay circuit in the plurality of digital delay circuits comprises a digitally programmable delay circuit, a controlled buffer, or a controlled inverter. In the case of digitally programmable delay circuits, the digital loop filter produces a digital control word to program a delay of each programmable digital delay circuit. Each programmable digital delay circuit further comprises a pair of inverters coupled in a cascade configuration. The first current powers the first inverter, and wherein the second current powers the second inverter.

Referring to the fourth exemplary embodiment above, the plurality of digital delay circuits, the digital phase detector, and the digital loop filter form a digital feedback loop. Referring to the fourth exemplary embodiment above, an output of the Nth delay circuit in the plurality of digital delay circuits couples to a first input of the digital phase detector. A reference clock couples to a second input of the digital phase detector. An output of the digital phase detector couples to an input of the digital loop filter.

In a fifth exemplary embodiment, a signal generator for producing a set of signals having a phase relationship to one another comprises an all-digital delay-locked loop (DLL) circuit that produces the set of signals, wherein the set of signals have equally spaced phases. The all-digital delay-locked loop (DLL) circuit comprises an integrating signal loop. The signal loop comprises a digital loop filter. The digital loop filter has a $$T(z) = \frac{\alpha}{(1 - \rho Z^{-1})},$$

transfer function wherein $\alpha$ and $\rho$ are coefficients.

Referring to the fifth exemplary embodiment, the all-digital delay-locked loop (DLL) circuit comprises stages 1 through N. Each of the first through (N−1)st stage produces one signal in the set of signals. The all-digital delay-locked loop (DLL) circuit uses negative feedback to main the phase relationship in the set of signals.

In a sixth exemplary embodiment, a method of generating a set of signals having a pre-determined phase relationship comprises digitally generating a set of N−1 signals; and using digital feedback to maintain an equal phase spacing for the N−1 signals. Digitally generating the set of N−1 signals comprises programming a set of delay periods. Programming the set of delay periods comprises programming a set of current values.

Referring to the sixth exemplary embodiment, the method further comprises generating a phase error signal. The method further comprises integrating the error signal to generate a set of control signals. Digitally generating the set of N−1 signals comprises programming a set of delay periods with the set of control signals. Programming the set of delay periods with the set of control signals comprises programming a set of current values.

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as the presently preferred or illustrative embodiments. Persons skilled in the art may make various changes in the shape, size and arrangement of parts without departing from the scope of the disclosure described in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An all-digital serializer-de-serializer, comprising:
   an all-digital clock multiplier unit (CMU) circuit;
   an all-digital clock and data recovery (CDR) circuit coupled to the all-digital clock multiplier unit (CMU) circuit;
   a multiplexer (MUX), coupled to all-digital clock multiplier unit (CMU) circuit, configured to serialize data;
   a demultiplexer (DeMUX), coupled to the all-digital clock and data recovery (CDR) circuit, configured to de-serialize data;
   a first phase detector that accepts a reference clock signal;
   a first digital loop filter coupled to the first phase detector;
   a first digitally controlled oscillator coupled to the first digital loop filter; and
   a second digitally controlled oscillator.

2. The all-digital serializer-de-serializer according to claim 1, wherein the first and second digitally controlled oscillators are matched to each other.

3. The all-digital serializer-de-serializer according to claim 1, wherein the all-digital clock and data recovery (CDR) circuit further comprises a second phase detector.

4. The all-digital serializer-de-serializer according to claim 3, wherein the all-digital clock and data recovery (CDR) circuit further comprises a second digital loop filter coupled to the second phase detector.

5. The all-digital serializer-de-serializer according to claim 1, further comprising a digital control circuit coupled to the all-digital clock multiplier unit (CMU) circuit and the all-digital clock and data recovery (CDR) circuit.

6. A programmable logic device (PLD), comprising:
   a serializer-de-serializer circuit, comprising:
      an all-digital clock multiplier unit (CMU) circuit; and
      an all-digital clock and data recovery (CDR) circuit coupled to the all-digital clock multiplier unit (CMU) circuit,
      wherein the all-digital clock multiplier unit (CMU) circuit and the all-digital clock and data recovery (CDR) circuit include matched digitally controlled oscillators.

7. The programmable logic device (PLD) according to claim 6, further comprising a multiplexer (MUX) coupled to the all-digital clock multiplier unit (CMU) circuit.

8. The programmable logic device (PLD) according to claim 7, wherein the multiplexer (MUX) serializes data to generate serialized data signals.

9. The programmable logic device (PLD) according to claim 6, further comprising a demultiplexer (DeMUX) coupled to the all-digital clock and data recovery (CDR) circuit.

10. The programmable logic device (PLD) according to claim 9, wherein the demultiplexer (DeMUX) de-serializes data to generate de-serialized data signals.

11. The programmable logic device (PLD) according to claim 8, wherein the serialized data signals comprise differential signals.

12. The programmable logic device (PLD) according to claim 8, wherein the serialized data signals comprise low voltage differential signals (LVDS).

13. The programmable logic device (PLD) according to claim 8, wherein the serialized data signals comprise single-ended signals.

14. The programmable logic device (PLD) according to claim 10, wherein the de-serialized data signals comprise differential signals.

15. The programmable logic device (PLD) according to claim 10, wherein the de-serialized data signals comprise low voltage differential signals (LVDS).

16. The programmable logic device (PLD) according to claim 10, wherein the de-serialized data signals comprise single-ended signals.

17. The programmable logic device (PLD) according to claim 6, further comprising a master-slave interface circuit that replicates a set of control words from the digitally controlled oscillator in the all-digital clock multiplier unit (CMU) circuit to the matched digitally controlled oscillator in the all-digital clock and data recovery (CDR) circuit.

18. A method of processing signals in an integrated circuit (IC), the method comprising:
digitally producing a multiplied clock signal from a reference clock signal, wherein digitally producing the multiplied clock signal from the reference clock signal comprises digitally generating a first signal used to produce the multiplied clock signal; and
digitally acquiring data and clock signals from a first set of data signals to generate acquired data signals and an acquired clock signal, wherein digitally acquiring data and clock signals from the first set of data signals comprises digitally generating a second signal that is matched to the first signal.

19. The method according to claim 18, further comprising digitally de-serializing the acquired data signals.

20. The method according to claim 18, further comprising digitally serializing a second set of data signals, by using the multiplied clock signal, to generate serialized data signals.

21. The method according to claim 18, further comprising monitoring a lock between the reference clock signal and a clock signal obtained by dividing down the multiplied clock signal.

22. The method according to claim 18, further comprising equalizing the first set of data before digitally acquiring data and clock signal.

23. The method according to claim 20, further comprising transmitting the serialized data signals via a single-ended signal link.

24. The method according to claim 20, further comprising transmitting the serialized data signals via a differential signal link.

25. The method according to claim 18, wherein the first set of data signals comprise single-ended signals.

26. The method according to claim 18, wherein the first set of data signals comprise differential signals.

* * * * *